(12) United States Patent
Harmon

(10) Patent No.: US 11,264,422 B2
(45) Date of Patent: Mar. 1, 2022

(54) SCALABLE POSITION-SENSITIVE PHOTODETECTOR DEVICE

(71) Applicant: LightSpin Technologies Inc., Endicott, NY (US)

(72) Inventor: Eric Harmon, Norfolk, MA (US)

(73) Assignee: LightSpin Technologies Inc., Endicott, NY (US)

( * ) Notice: Subject to any disclaimer, the term of this patent is extended or adjusted under 35 U.S.C. 154(b) by 6 days.

(21) Appl. No.: 16/557,149

(22) Filed: Aug. 30, 2019

(65) Prior Publication Data
US 2021/0066382 A1 Mar. 4, 2021

(51) Int. Cl.
H01L 27/146 (2006.01)
H01L 27/144 (2006.01)
H01L 31/107 (2006.01)

(52) U.S. Cl.
CPC .... *H01L 27/14643* (2013.01); *H01L 27/1446* (2013.01); *H01L 27/14601* (2013.01); *H01L 31/107* (2013.01)

(58) Field of Classification Search
None
See application file for complete search history.

(56) References Cited

U.S. PATENT DOCUMENTS

| | | | |
|---|---|---|---|
| 6,831,263 B2 | 12/2004 | Skurnik et al. | |
| 6,952,003 B2 | 10/2005 | Skurnik et al. | |
| 7,476,864 B2 | 1/2009 | Benlloch Baviera et al. | |
| 9,076,707 B2 | 7/2015 | Harmon | |
| 9,698,181 B2 | 7/2017 | Moldovan et al. | |
| 9,768,211 B2 | 9/2017 | Harmon | |
| 10,529,884 B2 | 1/2020 | Harmon | |
| 2003/0222200 A1* | 12/2003 | Skurnik | H01L 27/1446 250/208.1 |
| 2011/0210255 A1 | 9/2011 | Kim et al. | |
| 2012/0175498 A1* | 7/2012 | Krymski | H01L 27/14609 250/208.1 |
| 2018/0078766 A1* | 3/2018 | Matolin | H04N 9/81 |

OTHER PUBLICATIONS (IDS NPL Cite 7) D'Incecco et al. "Development of a Novel Single-Channel 24cm^2, SiPM-based, Cryogenic Photodetector", IEEE Transactions on Nuclear Science, 2018, p. 591-596, vol. 65 Issue 1, IEEE (Year: 2018).*
Linear and sensitive CMOS positionsensitive photodetector A. Mäkynen and J. Kostamovaar Electronics Letters Jun. 11, 1998 vol. 34 No. 12 (Year: 1998).*

(Continued)

*Primary Examiner* — Robert K Carpenter
(74) *Attorney, Agent, or Firm* — Intrinsic Law Corp.

(57) ABSTRACT

A position-sensitive photodetector device includes a grid of series-connected photodetectors that are electrically coupled to either a vertical photodetector array (VA photodetectors) or to a horizontal photodetector array (HA photodetectors). The VA and HA photodetectors are arranged in an alternating sequence along rows and/or columns throughout the grid. A horizontal-position readout line is electrically coupled to a termination of each vertical photodetector array, and a vertical-position readout line is electrically coupled to a termination of each horizontal photodetector array.

19 Claims, 17 Drawing Sheets

(56) References Cited

OTHER PUBLICATIONS

High accuracy CMOS position-sensitive photodetector (PSD) A. Mäkynen, T. Ruotsalainen and J. Kostamovaara Electronics Letters Jan. 16, 1997 vol. 33 No. 2 (Year: 1997).*
High Performance CMOS position-sensitive photodetectors (PSDs) A. Mäkynen, T. Ruotsalainen, T. Rahkonen, and J. Kostamovaara (Year: 1998).*
M. Bieniosek, "Electronic Readout Strategies for Silicon Photomultipler-Based Positron Emisson Tomography Detectors", Mar. 2016, p. 1-121, Stanford University.
M. F. Bieniosek et al., "Achieving Fast Timing Performance with Multiplexed SiPMs", Physics in Medicine & Biology, 2016, p. 2879-2892, vol. 61, Institute of Physics and Engineering in Medicine.
H. Choe et al., "Protoype Time-of-Flight PET Utilizing Capacitive Multiplexing Readout Method", Nuclear Inst. and Methods in Physics Research Section A, Mar. 2019, p. 43-49, vol. 921, Elsevier.
P. W. Cattaneo et al., "Development of high Precision Timing Counter Based on plastic Scintillator with SiPM Readout", IEEE Transactions on Nuclear Science, Feb. 2014, p. 1-11, IEEE.
J. Du et al., "A Simple Capacitive Charge-Division Readout for Position-Sensitive Solid-State Photomultiplier Arrays", NIH Public Access Author Manuscript, Oct. 2013, p. 1-24, vol. 60 Issue 5, IEEE.
M. D'Incecco et al., "Development of a Novel Single-Channel, 24cm^2, SiPM-based, Cryogenic Photodetector", IEEE Transactions on Nuclear Science, 2018, p. 591-596,vol. 65 Issue 1, IEEE.
L. H. C. Braga et al., "A Fully Digital 8x16 SiPM Array for PET Applications With Per-Pixel TDCs and Real-Time Energy Output", IEEE Journal of Solid-State Circuits, Jan. 2014, p. 301-314, vol. 49, IEEE.
H. Park et al., "Hybrid Charge Division Multiplexing Method for Silicon Photomultiplier Based PET Detectors", IOP Science, May 2017, p. 4390-4405, vol. 62 No. 11, Institute of Physics and Engineering in Medicine.
K. Leki et al., "Large-Area MPPC with Enhanced VUV Sensitivity for Liquid Xenon Scintillation Detector", Nuclear Instruments and Methods in Physics Research Section A: Accelerators, Spectrometers, Detectors and Associated Equipment, Feb. 2019, p. 1-10, vol. 925, Elsevier.

G. B. Ko et al., "Development of a Front-end Analog Circuit for Multi-Channel SiPM Readout and Performance Verification for Various PET Detector Designs", Nuclear Instruments and Methods in Physic Research, 2013, p. 38-44, vol. 703, Elsevier.
S. I. Kwon et al., "Signal Encoding Method for a Time-of-Flight PET Detector Using a Silicon Photomultiplier Array", Nuclear Instruments and Methods in Physics Research A, 2014, p. 39-45, vol. 761, Elsevier.
M. F. Bieniosek et al., "A Multiplexed TOF and DOI Capable PET Detector Using a Binary Position Sensitive Network", Phys Med Biol, Nov. 2016, p. 1-21, vol. 61 No 21, Institute of Physics and Engineering in Medicine.
J. W. Cates et al., "Highly Multiplexed Signal Readout for a Time-of-Flight Positron Emission Tomography Detector Based on Silicon Photomultipliers", J. Med. Imag., 2017, p. 1-9, vol. 4 No. 1.
M. Janecek et al., "A High-Speed Multi-Channel Readout for SSPM Arrays", IEEE Transactions on Nuclear Science, 2012, p. 13-18, vol. 59 No. 1, IEEE.
J. W. Cates et al. , "Evaluation of a clinical TOF-PET detector design that achieves ≤100 ps coincidence time resolution", Phys Med Biol., 2018, p. 1-30, vol. 63 No. 11.
S. Moehrs et al., "A Small-Animal PET Design Using SiPMs and Anger Logic with Intrinsic DOI", IEEE Symposium Conference Record Nuclear Science, 2004, p. 3475-3479, vol. 6, IEEE.
M. F. Bieniosek et al., "Analog Filtering Methods Improve Leading Edge Timing Performance of Multiplexed SiPMs", Physics in Medicine & Biology, 2016, p. N427-N440, vol. 61, Institute of Physics and Engineering in Medicine.
P. Peng et al., "Compton PET: a layered structure PET detector with high performance", Physics in Medicine & Biology, 2019, pp. 1-16, vol. 64 No. 10, Institute of Physics and Engineering in Medicine.
V. Ilisie et al. , "Building blocks of a multi-layer PET with time sequence photon interaction discrimination and double Compton camera", Nuclear Inst. and Methods in Physics Research, 2018, pp. 1-28, vol. 895, Elsevier.
D. Schaart et al., "A novel, SiPM-array-based, monolithic scintillator detector for PET", Physics in Medicine and Biology, 2009, pp. 3501-3512, vol. 54, Institute of Physics and Engineering in Medicine.
J. Yeol Yeom et al., "Side readout of long scintillation crystal elements with digital SiPM for TOF-DOI PET", Med. Phys., 2014, pp. 1-9, vol. 41 No. 12, American Association of Physicists in Medicine.

* cited by examiner

SCALABLE POSITION-SENSITIVE PHOTODETECTOR DEVICE

STATEMENT REGARDING FEDERALLY-SPONSORED RESEARCH

This invention was made with U.S. government support under Contract No. N00253-17-C-0003, awarded by the Department of the Navy, and Grant No. 1R43MH115637-01, awarded by the National Institutes of Health (NIH). The U.S. government has certain rights in the invention.

TECHNICAL FIELD

The present application relates generally to position-sensitive photodetectors.

BACKGROUND

Photodetectors are used to sense light or other electromagnetic radiation and have a variety of applications. One application of photodetectors is to determine the position of a light source, which can be useful in ladar, lidar, tracking, other optical remote sensing applications, and medical applications.

One of the simplest position-sensitive readouts is a quadrant detector, where 4 photodetectors are used in a 2×2 array, with individual readouts for each detector, for example in quadrant detector 10 illustrated in FIGS. 1A and 1B. Position can be determined according to the following equations:

$$X_{position} = \frac{(I_A + I_B) - (I_C + I_D)}{I_A + I_B + I_C + I_D} \quad (1)$$

$$Y_{position} = \frac{(I_A + I_D) - (I_B + I_C)}{I_A + I_B + I_C + I_D} \quad (2)$$

where $I_A$, $I_B$, $I_C$, and $I_D$ are the photocurrents from photodetectors A, B, C, and D, respectively, as shown in FIGS. 1A and 1B.

When a light beam is centered directly on the middle of the 2×2 array (FIG. 1A), all four readouts will see about ¼ of the light intensity, with $I_A=I_B=I_C=I_D$, and the beam position will be zero (i.e., $X_{position}=Y_{position}=0$). When the light beam is off-center (FIG. 1B), there is an imbalance in the photocurrents, and the relative amount of imbalance can be estimated using Equations 1 and 2. For example in FIG. 1B, detector A receives the highest amount of current, followed by detector D, then detector B, then detector C.

One example of a photodetector is a silicon photomultiplier (SiPM), which is a solid-state photodetector with high internal gain (e.g., $1 \times 10^5$-$1 \times 10^7$), single-photon sensitivity, and low noise (e.g., dark noise <100 kcps/mm$^2$). SiPMs can be used to detect the optical output signal of scintillators, which are gamma-ray detectors that convert a high-energy gamma ray into a shower of photons.

Quadrant detection can be used with SiPM photodetectors to achieve position sensitivity, but it is limited by the photosensitive area of the SiPMs (typically <0.36 cm$^2$/SiPM), so the total photosensitive area of a SiPM quadrant detector would be 4×0.36 cm$^2$/SiPM or 1.44 cm$^2$). In principle, larger-area SiPMs could be fabricated; however, large-area SiPMs suffer from large capacitance (e.g., 5-50 nF/cm$^2$), and therefore low bandwidth and low signal amplitudes.

The high capacitance distorts the inherently fast signals of the SiPM, which are commonly read out with 50-ohm high-performance RF amplifiers. With a 50-ohm termination, the RC time constant is 250-2,500 ns/cm$^2$, limiting the frequency response to 60-600 kHz/cm$^2$. Fast timing performance generally requires high bandwidth, which limits the photosensitive area of the SiPM to much less than 1 cm$^2$. Commonly-used SiPMs for high-performance timing use a SiPM size of 0.1-0.2 cm$^2$. Some SiPM readout circuits also use a smaller termination resistance to improve the bandwidth, or they use various transimpedance amplifiers or bootstrap circuits to mitigate the high capacitance.

As the size of the photodetector array increases (e.g., beyond a 2×2 quadrant array), it is often prohibitive in terms of circuitry cost and power dissipation to use an individual readout circuit per 0.1-0.2 cm$^2$ of SiPM area.

One important application of position-sensitive photodetectors is for scintillator-coupled gamma cameras. A scintillator is a gamma-ray detector that converts the energy of a gamma ray into a shower of optical photons. Desirable properties of scintillator include high brightness (e.g., high numbers of optical photons for each gamma ray detected), fast rise times (e.g., rise time of the shower of optical photons) and fast decay times (e.g., decay of the shower of optical photons). Typical high-performance scintillators emit over 10,000 optical photons/MeV of gamma-ray energy, with picosecond rise times and nanosecond decay times.

In one embodiment of a scintillator-coupled gamma camera, the scintillator is mated to a position-sensitive photodetector, which detects the shower of optical photons and provides the position of the shower within the scintillator (X,Y position), the time of the shower (usually triggered by the rising edge), and an estimation of the number of photons detected, which is used to estimate the energy of the gamma ray.

As the surface area of scintillator-coupled gamma cameras increases, it generally becomes infeasible to use a quadrant detector due to limitations on photodetector size. This is particularly true for semiconductor photodetectors, because larger-area photodetectors have correspondingly larger capacitance, and therefore have lower bandwidth and increased capacitive noise.

One solution to achieving a larger surface area for gamma cameras was first described by Hal Anger (Anger, Hal O., "Scintillation Camera," Review of Scientific Instruments. 29, 27 (1958)), and therefore gamma cameras using this approach are typically called "Anger Cameras." The equations for determining the position of the gamma ray absorption in the scintillator are referred to as Anger Logic, with these equations generally being the same as equations 1 and 2 above.

The advantage of the Anger Camera is not simply in increasing the area of a gamma camera; it also addresses the issue of light sharing among the quadrants of a quadrant detector. As the area of a quadrant detector is increased, it becomes more likely that the light beam will no longer intersect all four photodetectors. Instead, nearly all of the light beam will only intersect one photodetector (e.g., as illustrated in FIG. 2A), and position sensitivity degrades and may be lost completely. The Anger Camera solution breaks the quadrant detector into an array of photodetector elements (e.g., as illustrated in FIG. 2B) so that for at least some section of the Anger Camera, the light is still divided between 4 or more photodetectors, and position sensitivity is regained.

Examples of conventional Anger logic circuit connections include (a) resistive mesh connections (FIG. 3), (b) capacitive mesh connections (FIG. 4), and (c) hybrid mesh connections (FIG. 5) of photodetectors 100 with current photocurrent outputs A-D.

In the resistive mesh connections illustrated in FIG. 3, where all the cathodes 105 (or all the anodes) of the photodetectors are connected in common. The anodes 105 (or cathodes) of photodetectors 100 are connected in rows 300 using a resistor 310 between the anode 105 (or cathode) of each photodetector 100. The rows 300 of the photodetector array are connected to adjacent rows 300 at both ends using another resistor between each row 300. The outputs A-D are at the corners of the array. The photodetector current is divided between each of the four corners in inverse proportion to the total resistance between the photodetector and the corner contact (e.g., as in a resistive divider).

In the capacitive mesh connections illustrated in FIG. 4, where all the cathodes 105 (or all the anodes) of the photodetectors are connected in common. The anodes 105 (or cathodes) of photodetectors 100 are connected in rows 300 using a capacitor 420 between the anode 105 (or cathode) of each photodetector 100. The rows 300 of the photodetector array are connected to adjacent rows 300 at both ends using another capacitor 420 between each row 300. The outputs A-D are at the corners of the array. High-frequency photodetector current is divided between each of the four corners in direct proportion to the effective capacitance between the photodetector and each corner contact. Because the capacitors 420 are electrically coupled in series, and assuming that all capacitors 420 have equal capacitance, a connection of 10 capacitors in series has 1/10th the impedance of a single capacitor. In general, capacitive mesh connections generally also require a direct current path to ground at each node as well, since the circuit is AC coupled.

In the hybrid mesh connections illustrated in FIG. 5, where all the cathodes 105 (or all the anodes) of the photodetectors are connected in common. The anodes 105 (or cathodes) of photodetectors 100 are connected in rows 300 using a parallel connection of a resistor 310 and a capacitor 420 between the anode 105 (or cathode) of each photodetector 100. The rows 300 of the photodetector array are connected to adjacent rows 300 at both ends using another parallel-connected resistor 310 and capacitor 420 between each row 300. The outputs A-D are at the corners of the array. Photodetector current is divided between each of the four corners in inverse proportion to the effective impedance between the photodetector and each corner contact.

The equivalent circuit model for one row 300 of 4 photodetectors 100 using any of the conventional Anger logic connections in FIGS. 3-5 can be generalized as equivalent circuit 60 in FIG. 6 including the parallel resistor ($R_h$) and capacitor ($C_h$) connection, the capacitance of each photodetector 100 ($C_D$), the shunt resistance of each photodiode ($R_s$), and the photocurrent of each photodiode ($I_{DN}$). The photocurrent ($I_{DN}$) of each photodetector 100 is relatively independent and splits according to the effective impedance to outputs A and D, so the photocurrent on the left side (output A) does not need to equal the current on the right side (output D). To convert the generalized equivalent circuit 60 to the resistive mesh configuration (FIG. 3), the capacitance of $C_h$ is set to zero. To convert the generalized equivalent circuit 60 to the capacitive mesh configuration (FIG. 4), the resistance of $R_h$ is set to infinity. The shunt resistance (Rs) of each photodetector may also include an external resistor component. This is because many photodetectors have nearly infinite Rs, and for the capacitive mesh configuration it may be necessary to provide a DC path to ground, so an external shunt resistor is used.

FIG. 7 illustrates generalized equivalent circuit 60 of conventional Anger logic when photodetector 2 is triggered (i.e., $I_{D1}=I_{D3}=I_{D4}=0$). The currents split right/left based on the impedance ratio to contacts A and D. In the conventional Anger Logic connection, there are low-impedance paths through the photodetector capacitance $C_D$ of each element in the array to the common connection (ground in FIG. 7), which significantly reduces the current available for readout at contacts A and D. The current reduction caused by this low impedance path to the common connection for each photodetector limits scaling of conventional Anger logic to large arrays of photodetectors. Additionally, scaling conventional Anger logic to large arrays often results in spatial resolution degradation because a smaller fractional change in signal between adjacent photodetectors is required as the number of photodetectors increases. For example, for a 10×10 photodetector array, the signal must be split into 1/10 increments for both X- and Y-directions, while for a 100×100 photodetector array, signal must be split into 1/100 increments for both directions. Non-linear charge sharing and the loss of signal to the common connection causes further degradation.

In addition to the foregoing problems, all configurations of conventional Anger logic generally suffer from excessive capacitance loading of the output (e.g., due to the parallel connection of the photodetectors) that reduces bandwidth. The capacitive mesh configurations of conventional Anger logic also suffer from undershoot (AC coupling of a unipolar pulse always converts it into a bipolar pulse). The hybrid mesh configuration of conventional Anger logic partially solves the problems of excessive capacitive loading and undershoot by pole zero cancellation, but it does not generally solve the problem of scaling to large arrays.

One application of gamma cameras is in nuclear medicine. For example, positron emission tomography (PET) is used to detect positron emission decays in cancer patients. A common PET tracer is fluorodeoxyglucose (FDG). Before the PET scan, a small amount of FDG is injected into the patient. Because cancer grows at a faster rate than healthy tissue, cancer cells absorb more of the FDG. The PET scanner detects the gamma rays given off by the FDG and produces images of the body that show both normal and cancerous tissue. Accurate localization of the X-Y position of the Gamma ray detection event is often achieved using an Anger Logic connection of photodetector elements.

Modern commercial PET machines include the capability to measure time-of-flight. The FDG tracer emits positrons which annihilate and produce a pair of counter-propagating gamma rays. The PET machine uses coincidence detection between opposing gamma cameras to determine a line of response which ideally indicates that the FDG tracer was located somewhere along the line. Time-of-Flight PET (TOF-PET) uses the time difference of the detection event at the opposing gamma cameras to estimate more precisely where the FDG is located in position along the line of response. TOF-PET enables higher sensitivity to be achieved, enabling higher resolution images to be achieved at a lower radioactive dose to the patient. Therefore it is critical for TOF-PET applications that the gamma camera have the best possible timing performance. For example, timing resolution of less than 100 picoseconds would enable improved performance in TOF-PET applications.

It would be desirable to form a scalable photodetector array having both high spatial (X-Y) and temporal resolution.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

An aspect of the invention is directed to a position-sensitive device comprising: a photodetector grid comprising: horizontal arrays of HA photodetectors, the HA photodetectors in each horizontal array electrically coupled in series to each other; and vertical arrays of VA photodetectors, the VA photodetectors in each vertical array electrically coupled in series to each other; a vertical output line electrically coupled to each horizontal array of HA photodetectors; a horizontal output line electrically coupled to each vertical array of VA photodetectors, wherein the HA and VA photodetectors are arranged in an alternating sequence to form the photodetector grid.

In one or more embodiments, the photodetector grid comprises rows and columns, the HA and VA photodetectors in each row comprise the HA photodetectors from one of the horizontal arrays and individual VA photodetectors from different respective vertical arrays to form the alternating sequence of the HA and VA photodetectors along the row, and the HA and VA photodetectors in each column comprise the VA photodetectors from one of the vertical arrays and individual HA photodetectors from different respective horizontal arrays to form the alternating sequence of the HA and VA photodetectors along the column. In one or more embodiments, the HA photodetectors in adjacent horizontal arrays are positionally-offset along a horizontal axis, and the VA photodetectors in adjacent vertical arrays are positionally-offset along a vertical axis. In one or more embodiments, the HA and VA photodetectors are arranged in a checkerboard configuration.

In one or more embodiments, wherein the HA and VA photodetectors are arranged in a striped configuration. In one or more embodiments, the photodetector grid comprises rows and columns, and each column includes the VA photodetectors from a corresponding vertical array and individual HA photodetectors from different respective horizontal arrays. In one or more embodiments, a first group of rows includes the HA photodetectors from a corresponding horizontal array, and a second group of rows includes individual VHA photodetectors from different respective vertical arrays.

In one or more embodiments, a shunt resistor is electrically coupled in parallel with each HA photodetector and in parallel with each VA photodetector. In one or more embodiments, the device further comprises passive circuit elements electrically coupled to the vertical output line, wherein each horizontal array has a horizontal array termination that is electrically coupled to the vertical output line, the passive circuit elements and the horizontal array terminations in an alternating arrangement along the vertical output line. In one or more embodiments, the device further comprises first and second outputs at opposing ends of the vertical output line and one of the passive circuit elements is electrically coupled to the vertical output line between the first output and a first outermost horizontal array termination and another of the passive circuit elements is electrically coupled to the vertical output line between the second output and a last outermost horizontal array termination. In one or more embodiments, each passive circuit element comprises a resistor, a capacitor, and/or an inductor. In one or more embodiments, each passive circuit element comprises a resistor electrically disposed in parallel with a capacitor.

In one or more embodiments, the device further comprises passive circuit elements electrically coupled to the horizontal output line, wherein each vertical array has a vertical array termination that is electrically coupled to the horizontal output line, the passive circuit elements and the vertical array terminations in an alternating arrangement along the horizontal output line. In one or more embodiments, the device further comprises first and second outputs at opposing ends of the horizontal output line and one of the passive circuit elements is electrically coupled to the horizontal output line between the first output and a first outermost vertical array termination and another of the passive circuit elements is electrically coupled to the horizontal output line between the second output and a last outermost vertical array termination.

In one or more embodiments, terminations of the vertical and horizontal arrays are electrically coupled to a common output. In one or more embodiments, the device further comprises an RF amplifier that is electrically coupled between the terminations and the common output. In one or more embodiments, the HA photodetectors are the VA photodetectors are the same type of photodetector. In one or more embodiments, the device further comprises the HA photodetectors and the VA detectors comprise silicon photomultipliers, PIN photodiodes, PN diodes, photoconductors, and/or avalanche photodiodes.

BRIEF DESCRIPTION OF THE DRAWINGS

For a fuller understanding of the nature and advantages of the present concepts, reference is made to the following detailed description of preferred embodiments and in connection with the accompanying drawings.

DETAILED DESCRIPTION

A position-sensitive photodetector device includes a grid of series-connected photodetectors that are electrically coupled to either a vertical photodetector array (VA photodetectors) or to a horizontal photodetector array (HA photodetectors). The VA and HA photodetectors are arranged in an alternating sequence within rows and/or columns of photodetectors in the grid. In one embodiment, the grid has a checkerboard configuration. In the checkerboard configuration, each row includes all of the HA photodetectors from one of the horizontal photodetector arrays and separate VA photodetectors from different vertical photodetector arrays. In addition, each column includes all of the VA photodetectors from one of the vertical photodetector arrays and separate HA photodetectors from different horizontal photodetector arrays.

In another embodiment, the grid has a striped configuration. For example, in a horizontally-striped configuration, alternating rows include either only HA photodetectors or only VA photodetectors. For example, a first group of rows only includes HA photodetectors from each of a corresponding horizontal photodetector array. A second group of rows only includes an individual VA photodetector from different respective vertical photodetector arrays. Each column includes VA photodetectors from a corresponding vertical photodetector array and an individual HA photodetector from different respective horizontal photodetector arrays.

In another example, the grid can have a vertically-striped configuration where alternating columns include either only HA photodetectors or only VA photodetectors. For example, a first group of columns only includes VA photodetectors from each of a corresponding vertical photodetector array. A second group of columns only includes an individual HA photodetector from different respective horizontal photodetector arrays. Each row includes HA photodetectors from a corresponding horizontal photodetector array and an individual VA photodetector from different respective vertical photodetector arrays.

A horizontal-position readout line is electrically coupled to a termination of each vertical photodetector array, and a vertical-position readout line is electrically coupled to a termination of each horizontal photodetector array. A passive circuit element is electrically coupled on each readout line between adjacent terminations to attenuate the readout current in proportion to the position of the horizontal/ vertical array to determine the horizontal and vertical arrays that detected the light source. The dimensions of the photodetectors are selected so that the light source is directed onto at least three photodetectors (at least one VA photodetector and at least one HA photodetector) so that the two-dimensional position of the light source can be determined.

Figure 8:
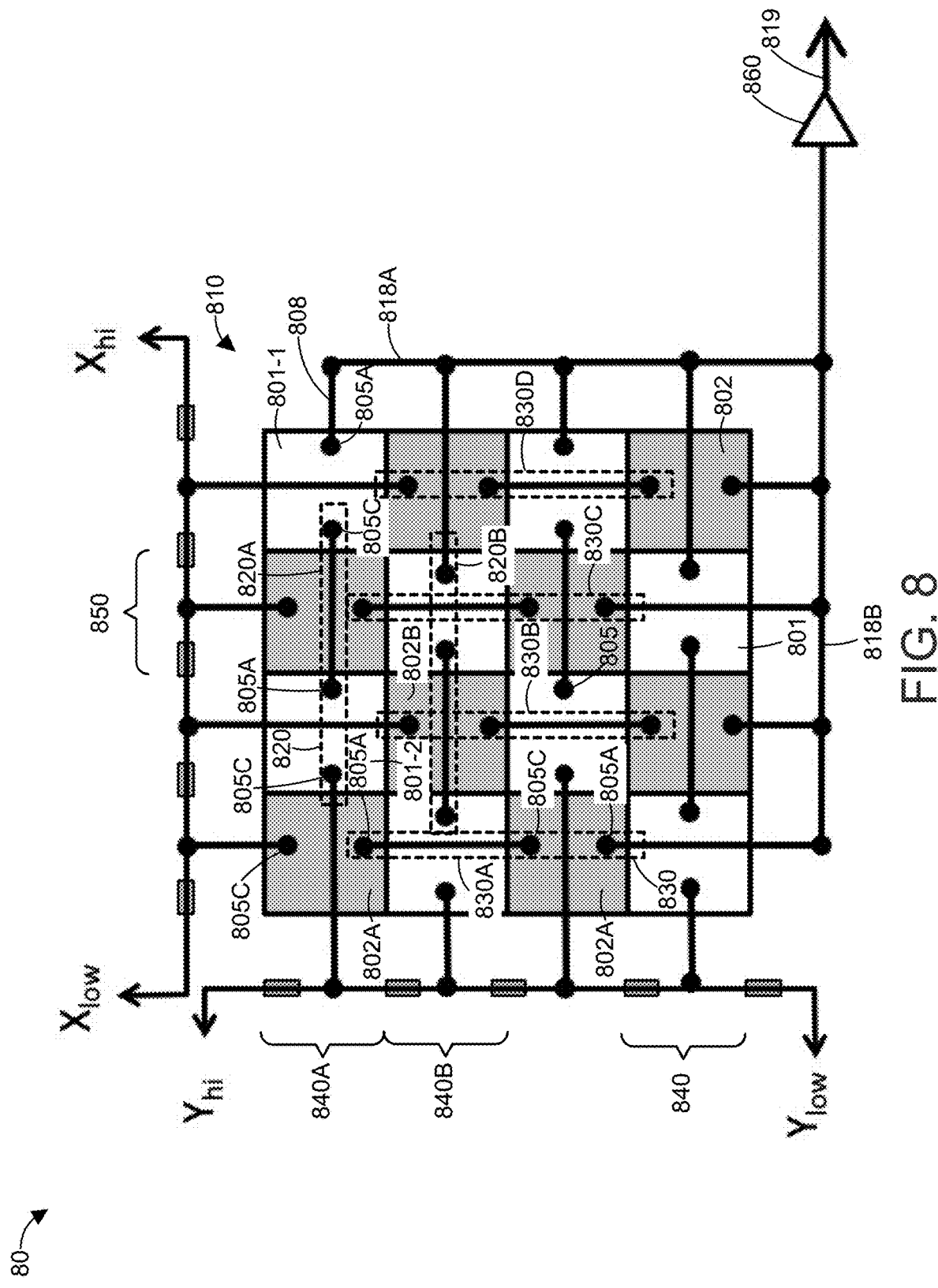
FIGS. 8 and 9 are schematic diagrams of a position-sensitive device according to one or more embodiments.

FIG. 8 is a schematic diagram of a position-sensitive photodetector device 80 according to one or more embodiments. The device 80 includes a plurality of photodetectors arranged as a photodetector grid 810. The photodetector grid 810 includes horizontal arrays 820 of HA photodetectors 801 and vertical arrays 830 of VA photodetectors 802. The HA photodetectors 801 are illustrated as white squares in photodetector grid 810 and the VA photodetectors 802 are illustrated as gray squares in photodetector grid 810, where the black dots 805 represent the series connection between each element of the horizontal arrays 820 and vertical arrays 830, respectively.

Each HA and VA photodetector 801, 802 has a photosensitive area that corresponds to the white and gray square, respectively. In some embodiments, the HA and VA photodetectors 801, 802 are about 1 mm to about 4 mm in width (e.g., in the horizontal direction in FIG. 8) and 1 mm to about 4 mm in length (e.g., in the vertical direction in FIG. 8). In each horizontal array 820, the HA photodetectors 801 are electrically coupled in series to each other, where the anode 805A of the first element 802-1 is connected to a first common connection wire 818A (e.g., via a conductive wire segment 808), and the cathode 805C of the first element is connected to the anode 805A of the next element 802-2. Likewise, the VA photodetectors 802 in each vertical array 830 are electrically coupled in series to each other. For example, the anode 805A of the first element 801-1 is connected to a second common connection wire 818B, and the cathode 805C of the first element 801-1 is connected to the anode 805A of the next element 801-2. The first and second common connection wires 818A, 818B are electrically coupled to a common output 819. An optional RF amplifier 860 can be electrically coupled between the common output 819 and one of the common connection wires 818A, 818B.

The HA and VA photodetectors 801, 802 are arranged in rows 840 and columns 850 to form the photodetector grid 810. Each row 840 includes all of the HA photodetectors 801 in a corresponding horizontal array 820 and one VA photodetector 802 of each vertical array 830 that falls within the respective row 840. For example, row 840A includes all of the HA photodetectors 801 in horizontal array 820A and one VA photodetector 802 of each vertical array 830A, 830C (e.g., VA photodetector 802A of vertical array 830A). Row 840A does not include any VA photodetectors 802 from vertical arrays 830B or 830D. In another example, row 840B includes all of the HA photodetectors 801 in horizontal array 820B and one VA photodetector 802 of each vertical array 830B, 830D (e.g., VA photodetector 802B of vertical array 830B). Row 840B does not include any VA photodetectors 802 from vertical arrays 830A or 830C.

Figure 9:
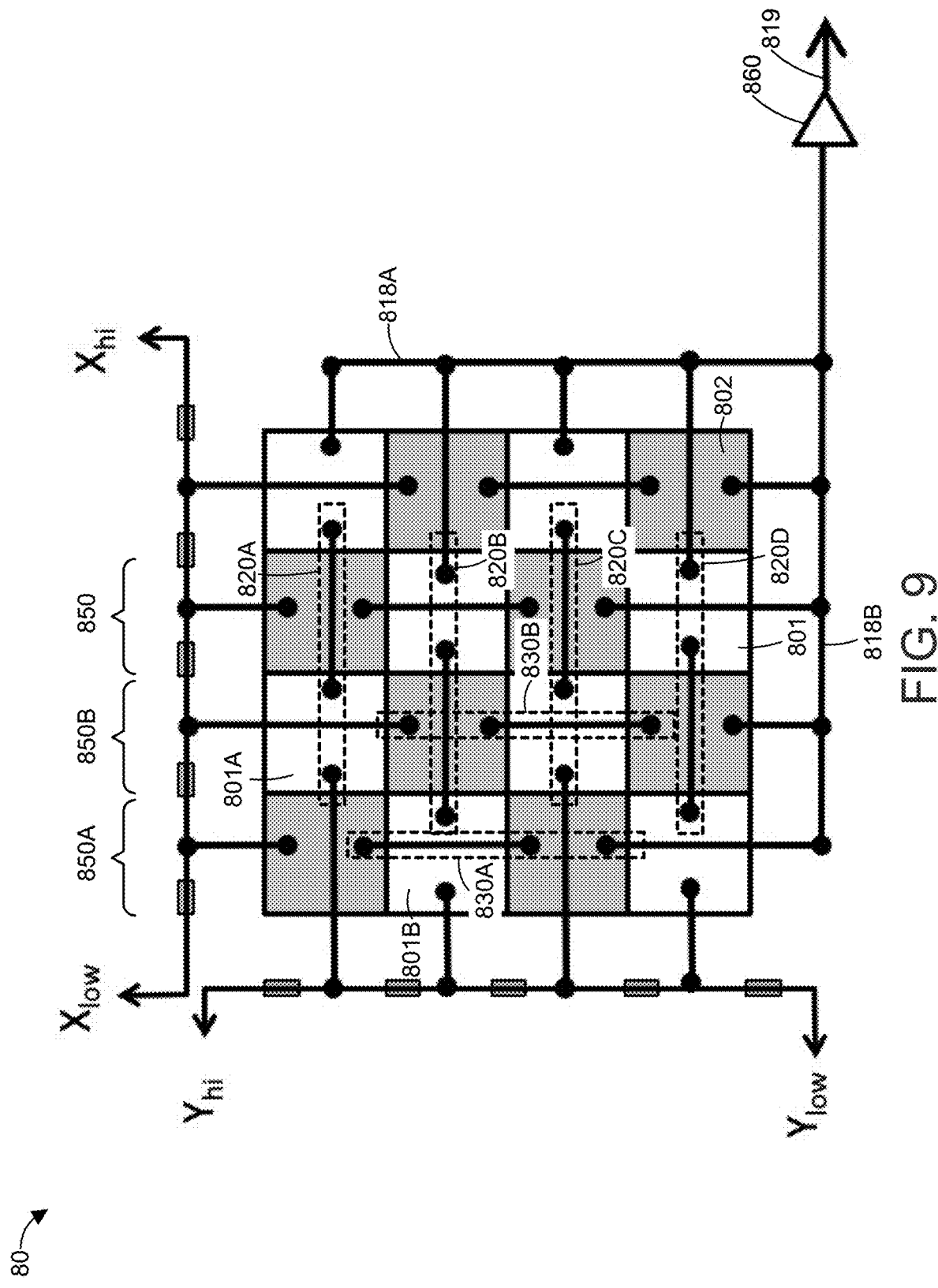

Each column 850 includes all of the VA photodetectors 802 in a corresponding vertical array 830 and one HA photodetector 801 of each horizontal array 820 that falls within the respective column 850, as illustrated in FIG. 9 for clarity. For example, column 850A includes all of the VA photodetectors 802 in vertical array 830A and one HA photodetector 801 of each horizontal array 820B, 820D (e.g., HA photodetector 801B of horizontal array 820B). Column 850A does not include any HA photodetectors 801 from horizontal arrays 820A or 820C. In another example, column 850B includes all of the VA photodetectors 802 in vertical array 830B and one HA photodetector 801 of each horizontal array 820A, 820C (e.g., HA photodetector 801A of horizontal array 820A). Column 850B does not include any HA photodetectors 801 from horizontal arrays 820B or 820D.

As can be seen, the photodetectors in each row 840 have an alternating sequence of HA and VA photodetectors 801, 802 as illustrated by the alternating gray and white squares. Likewise, the photodetectors in each column 850 have an alternating sequence of HA and VA photodetectors 801, 802. In one embodiment, the alternating sequence of HA and VA photodetectors 801, 802 in each row 840 and column 850 form a "checkerboard" configuration in photodetector grid 810.

The photodetector grid 810 includes a rectangular (M×N) array or a square array of photodetectors, though other shapes are possible (e.g., circular arrays, oval arrays, triangular arrays, hexagonal arrays, or other shape arrays).

In general, for an M×N array of photodetectors in a checkerboard configuration, where M and N are positive even integers, each row 840 has M/2 HA photodetectors 801 and each column 850 has N/2 VA photodetectors 802. When M equals N (in a square array), then each row 840 has N/2 HA photodetectors 801 and each column 850 has N/2 VA photodetectors 802. When M is a positive odd integer, the rows 840 alternate between having (M+1)/2 HA photodetectors 801 and (M−1)/2 HA photodetectors. Likewise, when N is a positive odd integer, the columns 850 alternate between having (N+1)/2 VA photodetectors 802 and (M−1)/2 VA photodetectors.

The HA photodetectors 801 and/or the VA photodetectors 802 can comprise silicon photomultipliers (SiPMs), PIN photodiodes, PN photodiodes, integrated avalanche photodiode arrays, photoconductors, avalanche photodiodes (APDs), and/or other photodetectors that can be electrically coupled in series. Examples of integrated avalanche photodiode arrays are disclosed in U.S. Pat. No. 9,076,707, titled "Integrated Avalanche Photodiode Arrays," U.S. Pat. No. 9,627,569, titled "Integrated Avalanche Photodiode Arrays," U.S. Pat. No. 9,768,211, titled "Integrated Avalanche Photodiode Arrays," and U.S. Patent Application Publication No. 2019/0140128, titled "Virtual Negative Bevel and Methods of Isolating Adjacent Devices," published on May 9, 2019, which are incorporated herein by reference. In some embodiments, the HA photodetectors 801 and the VA detectors 802 are the same type of photodetector. For example, each of the HA and VA photodetectors 801, 802 can be SiPMs. In another example, each of the HA and VA photodetectors 801, 802 can be PIN photodiodes. In another example, each of the HA and VA photodetectors 801, 802 can be PN photodiodes. In another example, each of the HA and VA photodetectors 801, 802 can be a portion of a corresponding integrated avalanche photodiode array. In another example, some or all of the HA photodetectors 801 and/or some or all of the VA photodetectors 802 can be same type of photodetector. In another example, some or all of the HA photodetectors 801 and/or some or all of the VA photodetectors 802 can be a different type of photodetector.

Figure 10:
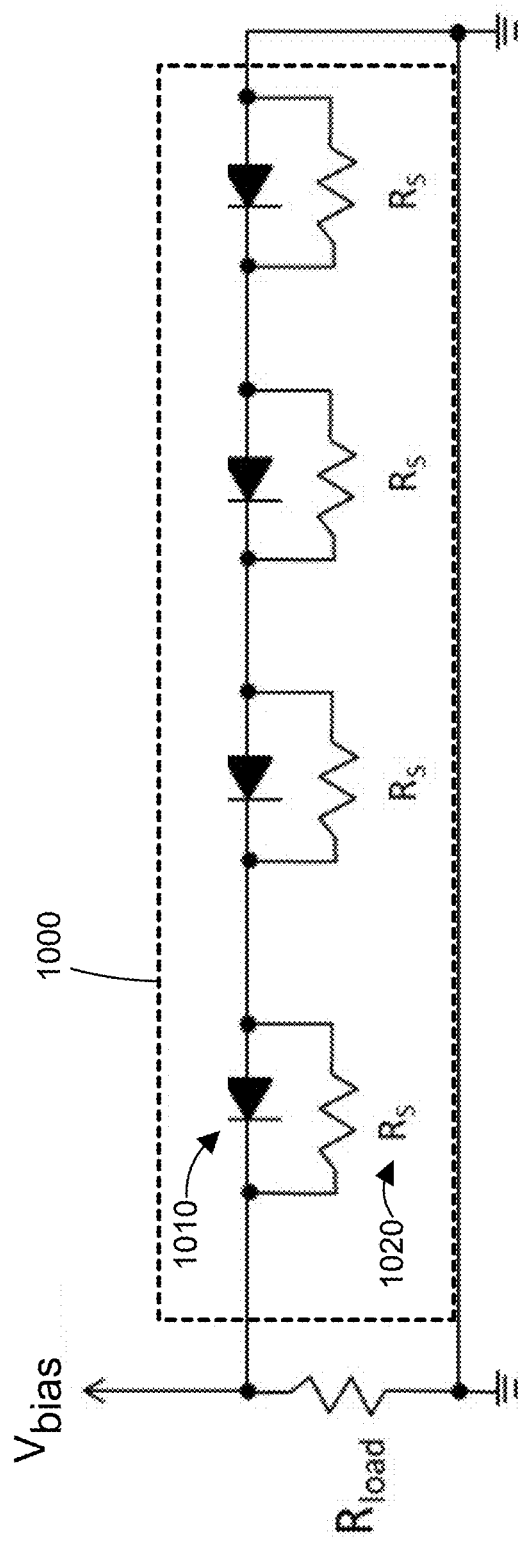
FIG. 10 is a schematic diagram of one row (or column) of a representative photodetector array according to one or more embodiments.

FIG. 10 is a schematic diagram of one row (or column) of a representative photodetector array 1000 according to one or more embodiments. The photodetector array 1000 can be the same as vertical array 830 and/or horizontal array 840. The photodetector array 1000 includes a plurality of photodetectors 1010 that are electrically coupled in series with each other. A bias voltage $V_{bias}$ is applied across the photodetectors 1010. A photocurrent is generated when one or more of the photodetectors 1010 detects a photon. An optional shunt resistor 1020 is electrically coupled in parallel to each photodetector 1010 to ensure that the bias voltage across each photodetector 1010 is substantially uniform (e.g., within about 10% or less of each other (e.g., in PIN or PN diodes), within about 1% or less of each other, or within about 0.1% of each other (e.g., in avalanche gain devices)) since the gain of each photodetector 1010 is dependent on the bias voltage.

Figure 1B:
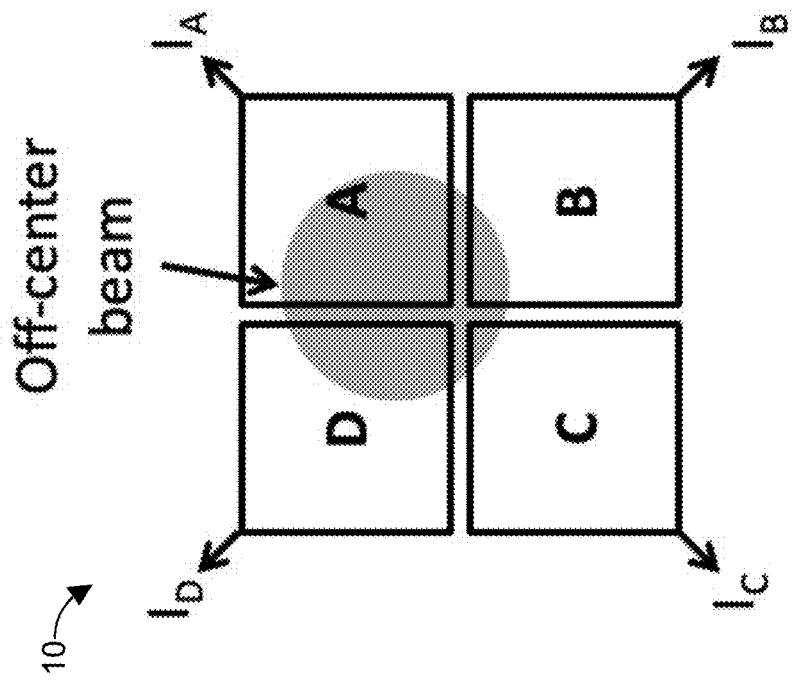
FIGS. 1A, 1B, and 2A are schematic diagrams of quadrant photodetectors according to the prior art.
Figure 1A:
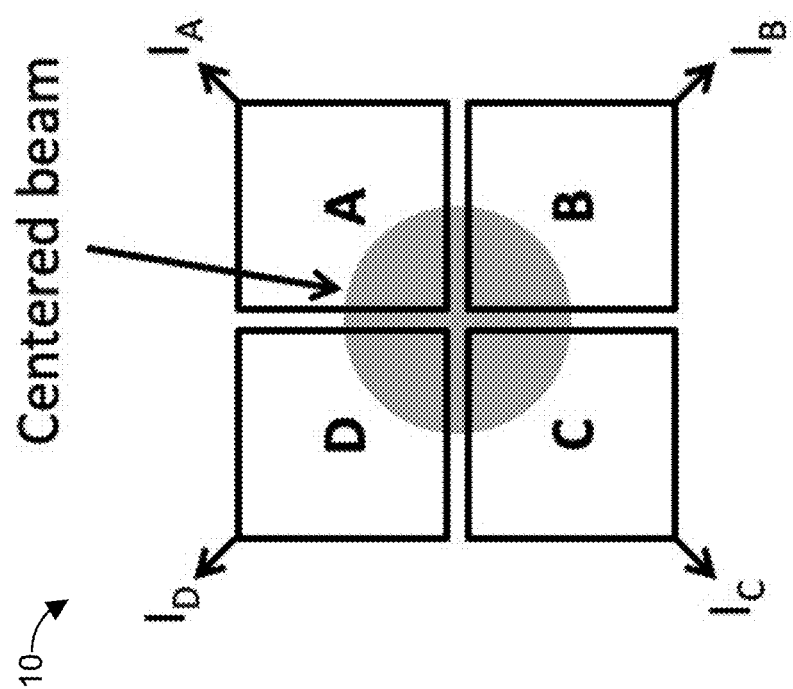
Figure 2B:
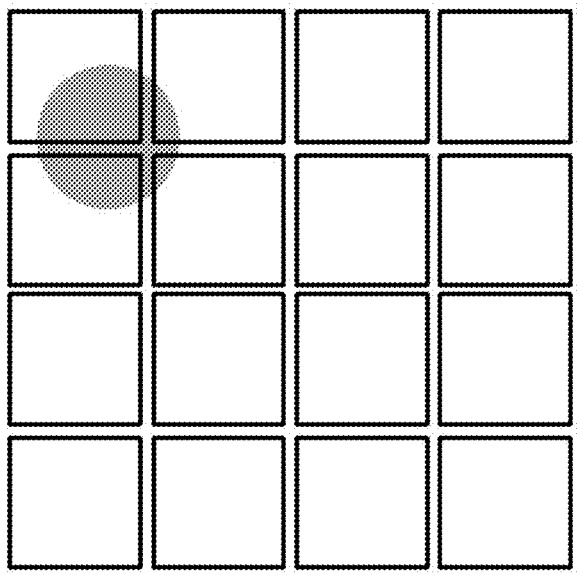
FIG. 2B is a schematic diagram of an array of photodetectors according to the prior art.
Figure 2A:
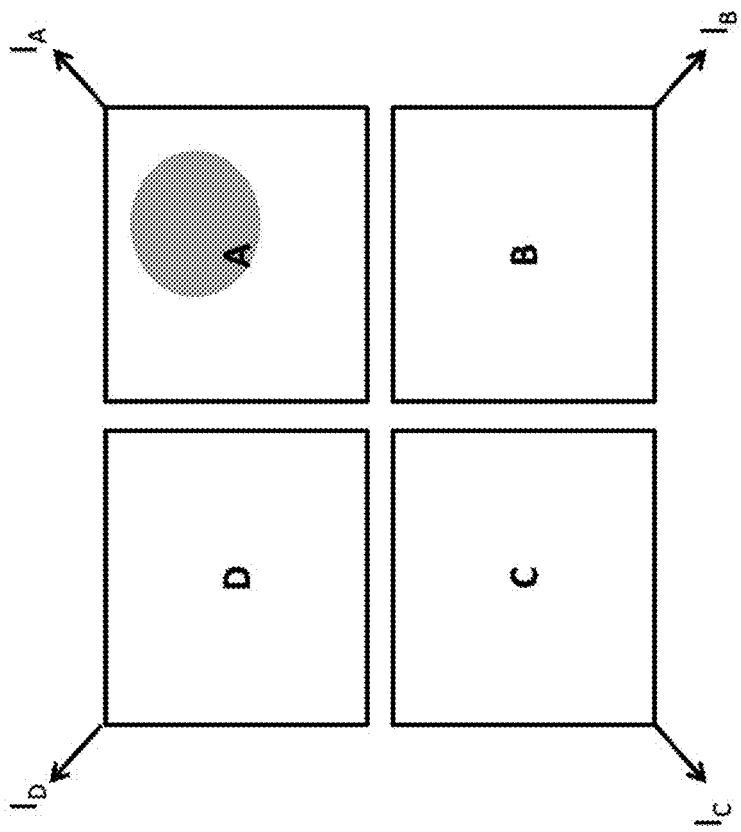
Figure 3:
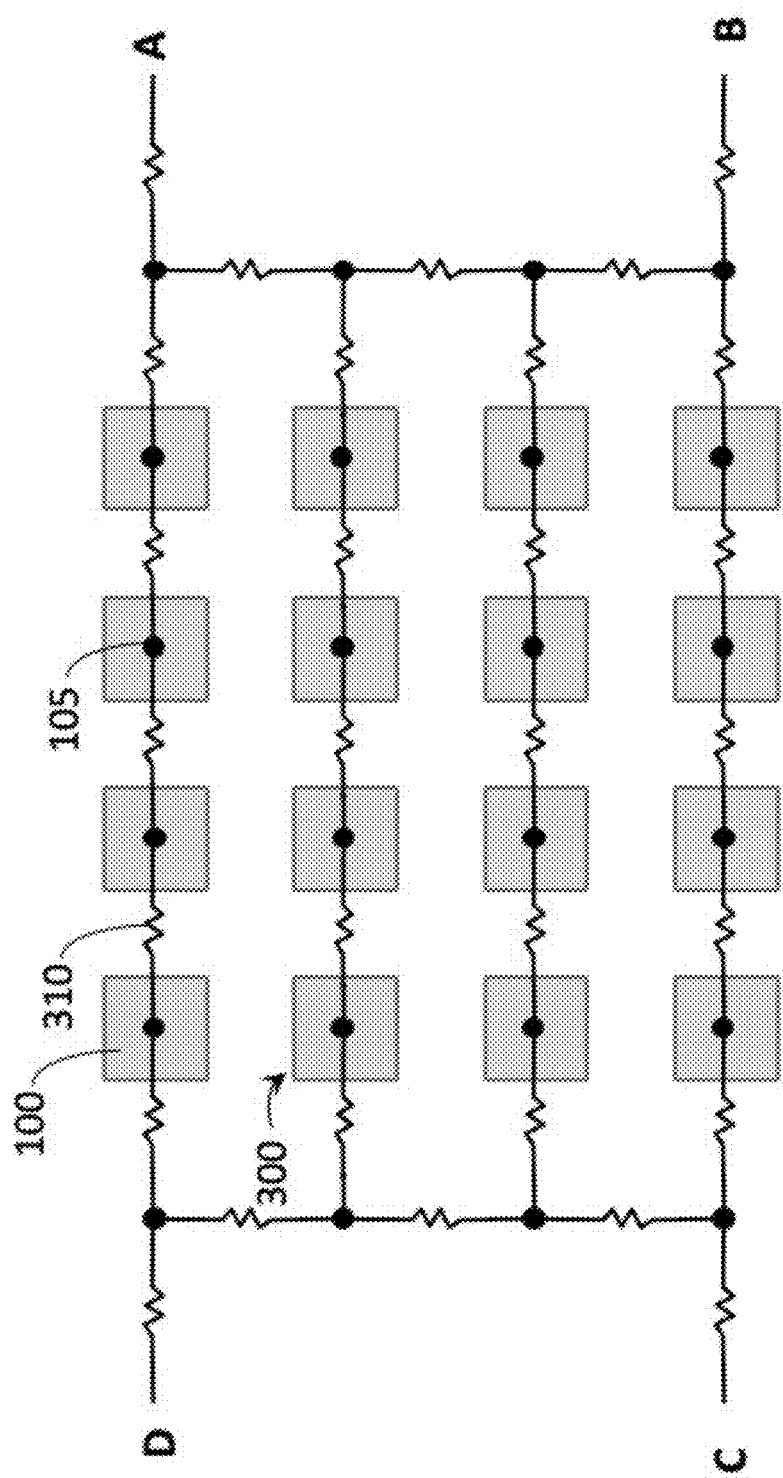
FIG. 3 is a schematic diagram of an array of photodetectors having resistive mesh connections according to the prior art.
Figure 4:
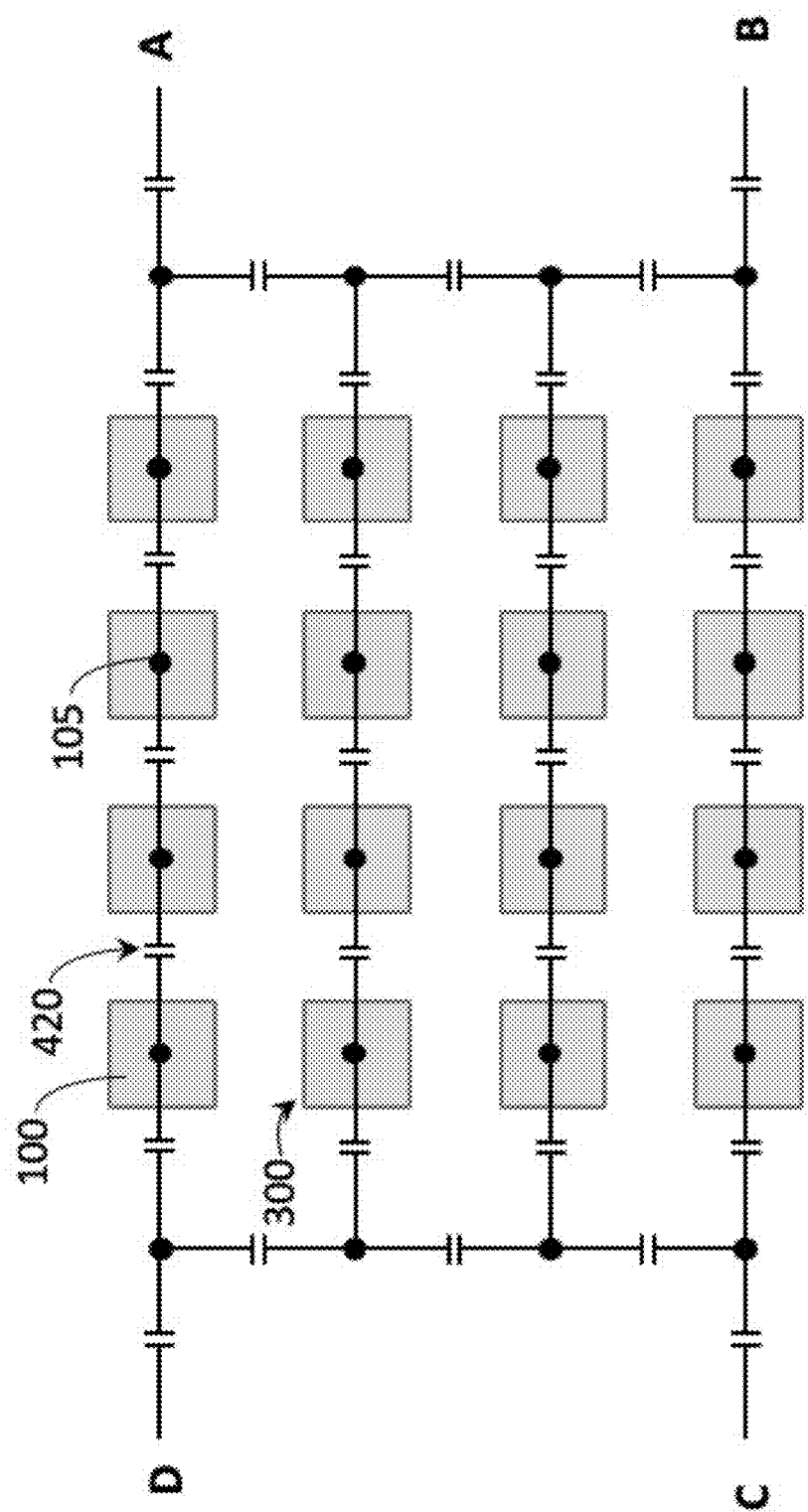
FIG. 4 is a schematic diagram of an array of photodetectors having capacitive mesh connections according to the prior art.
Figure 5:
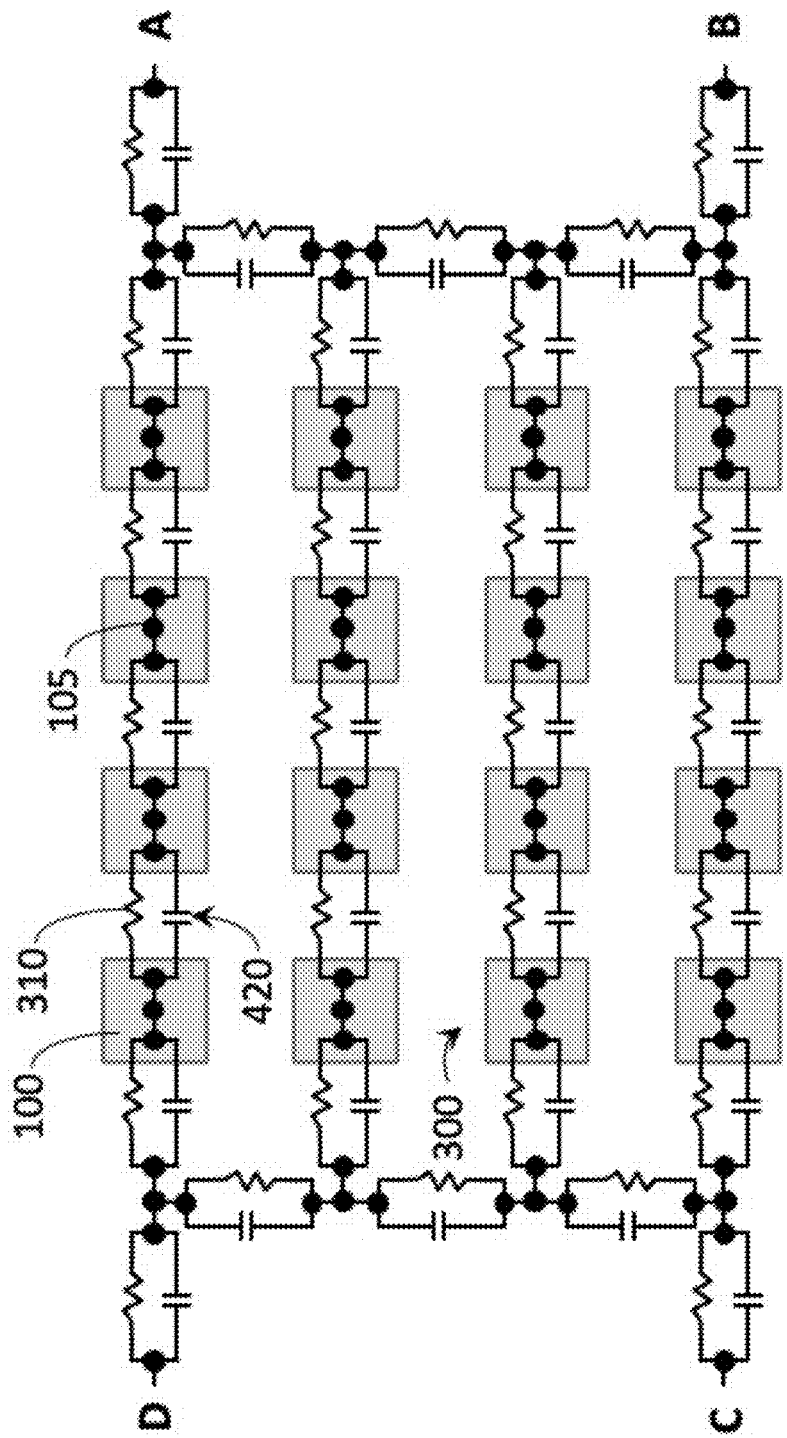
FIG. 5 is a schematic diagram of an array of photodetectors having hybrid mesh connections according to the prior art.
Figure 6:
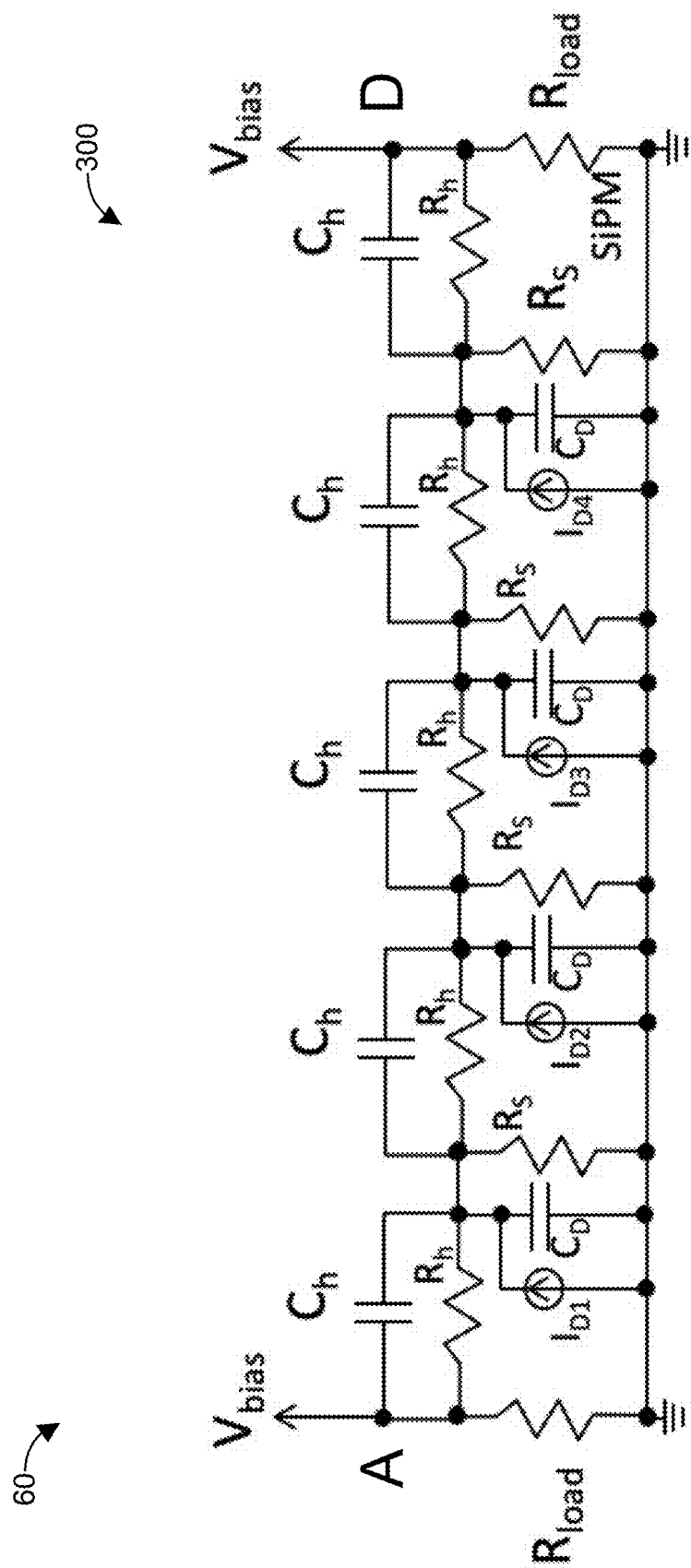
FIG. 6 is a generalized circuit diagram for the equivalent circuit of one row for the schematic diagrams of FIGS. 3-5.
Figure 7:
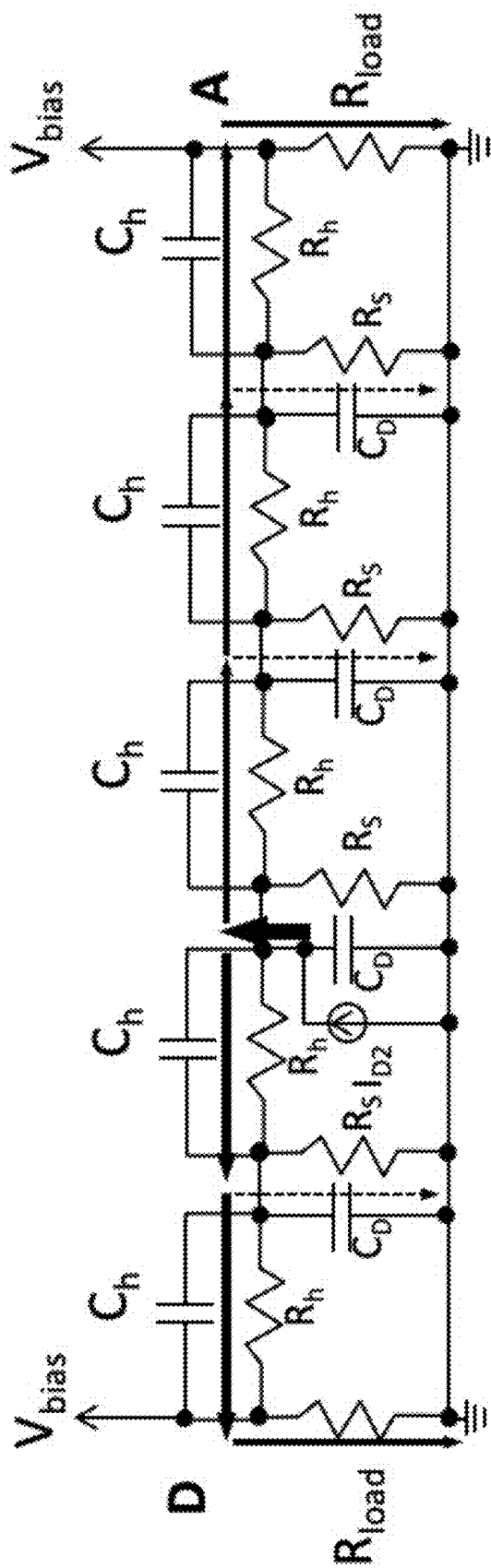
FIG. 7 illustrates the generalized circuit diagram of FIG. 6 when one of the photodetectors is triggered.
Figure 11:
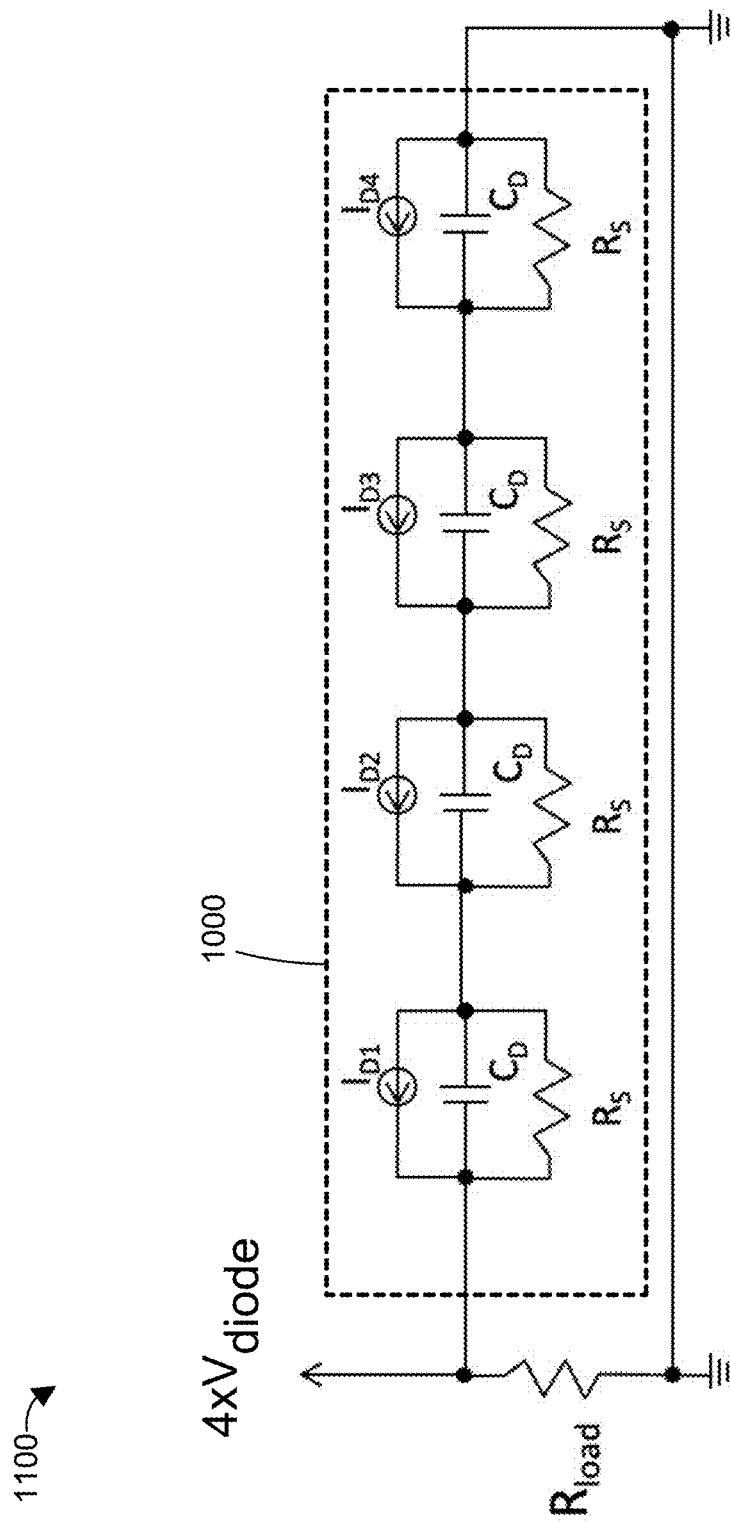
FIG. 11 is a circuit diagram of the equivalent circuit formed the representative photodetector array illustrated in FIG. 10.
Figure 12:
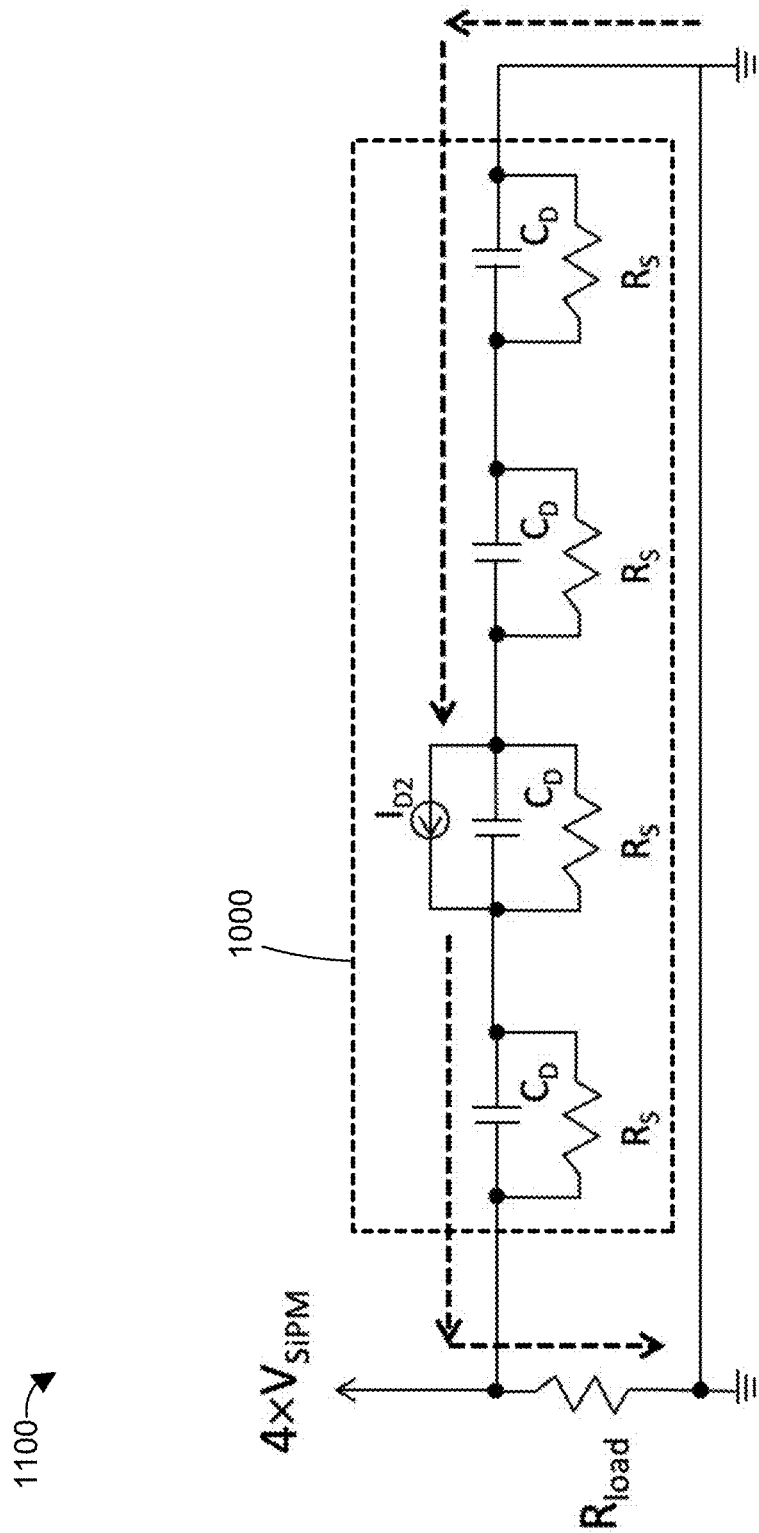
FIG. 12 illustrates the circuit diagram of FIG. 11 when one of the photodetectors is triggered.

FIG. 11 is a circuit diagram 1100 of the equivalent circuit formed by representative photodetector array 1000. The circuit diagram 1100 illustrates that each photodetector has a capacitance $C_D$ and a photocurrent $I_{DN}$ where N is the photodetector number (e.g., N is an integer of 1 to 4 in FIG. 4). The bias voltage is N times the bias voltage $V_{diode}$ of a given photodetector since N photodetectors are electrically coupled in series. Since there are 4 photodetectors in series in the photodetector array 1000, the bias voltage is 4×$V_{diode}$. The photocurrent $I_{DN}$ is zero until a photodetector (e.g., photodetector 2) detects a photon at which point photocurrent $I_{DN}$ (e.g., $I_{D2}$) flows through that photodetector, for example as illustrated in FIG. 12. Since the photodetectors are connected in series, the current $I_{D2}$ must also flow equally through all the other elements in the series connection. As can be seen in FIGS. 11 and 12, the identity of the photodetector that detected the photon(s) cannot be determined based on the current output by the photodetector array 1000. For example, the output current would appear the same regardless of which photodetector 1-4 detected the photon(s) when the photodetectors and the number of detected photos are otherwise the same.

Unlike the conventional Anger logic circuits, the photodetectors 1010 do not include a common connection (e.g., to ground) that often limits the scalability of photodetector arrays. In addition, the photodetector array 1000 has high temporal resolution (e.g., as simulated by the rise and fall times of the photodetector array 1000 in response to the detection of a single photon). For example, a simulation of the response of (a) a single SiPM, (b) 4 SiPMs in series and (c) 4 SiPMs in parallel yielded the following results (each SiPM was 3 mm×3 mm in size):

TABLE 1

|  | 1 SiPM | 4 SiPMs in series | 4 SiPMs in parallel |
| --- | --- | --- | --- |
| Rise time | <100 ps | <100 ps | <100 ps |
| Fall time | 10.9 ns | 2.7 ns | 60.6 ns |
| Fall time ratio | 1:1 | 1:4 | >4:1 |
| Peak voltage | 100% | >90% | 25% |
| Peak current | 100% | >90% | 100% |
| Integrated current | 100% | 25% | 100% |
| Voltage Bias | 100% | 400% | 100% |

As illustrated in Table 1, the fall time decreased when the SiPMs were electrically coupled in series and increased when they were electrically coupled in parallel. This can be explained by the effective capacitance of the SiPM array. When the SiPMs are electrically connected in series, the effective capacitance of the SiPM array decreases in direct proportion to the number of SiPMs in the series connection. The effect is that the voltage amplitude and signal rise time remain largely unchanged, while the signal fall time is reduced by a corresponding factor (e.g., by approximately 25% compared to a single SiPM). The result is that timing performance is almost independent of the number of SiPMs connected in series. Furthermore, there is no significant delay for signal propagation across the array of SiPMs.

In contrast, when the SiPMs are electrically connected in parallel, the effective capacitance of the SiPM array increases in direct proportion to the number of SiPMs in the parallel connection. The effect is an increase in the fall time in proportion to the effective capacitance (e.g., an increase of over 4× compared to a single SiPM), as well as a decrease in signal amplitude (e.g., the amplitude decreases by 4× compared to a single SiPM). In addition, there are substantial signal propagation delays since the parallel connection is analogous to a lumped element transmission line. In addition, the electrical noise component of the timing jitter scales in in proportion to the number of SiPMs connected in parallel.

Though Table 1 provides simulation data for different configurations of SiPMs, the simulation data would be the same as or similar to that for other types of photodetectors. For example, the simulation data would be the same as or similar to that of PIN photodiodes, PN diodes, integrated avalanche photodiode arrays, photoconductors, and APDs for the configurations in Table 1.

The electrical noise component of the timing jitter is determined according to the following equation:

$$\sigma_t(\text{electrical noise}) = \frac{\sigma_v(\text{electrical noise})}{dv/dt} \quad (3)$$

where $\sigma_t$ (electrical noise) is the timing jitter component (in seconds rms) due to electrical noise, $\sigma_v$ (electrical noise) is the electrical noise (in volts rms) at the readout circuit (timing circuit), and dv/dt is the slope of the pulse rising edge. In many cases, the timing jitter due to electrical noise is a significant component of the overall timing performance, so optimizing the electrical noise and the slope of the rising edge can significantly improve overall timing performance.

To a first-order approximation, dv/dt is proportional to Vmax/risetime, where Vmax is the peak value of the voltage response, and rise time is leading edge rise time of the pulsed response. This means that for a fixed $\sigma_v$ (electrical noise) and a fixed rise time, increasing Vmax results in a reduction in $\sigma_t$ (electrical noise).

Table 1 also indicates that for the series-connected photodetector arrays, the integrated current scales as 1/N, where N is the number of photodetectors connected in series, while for the parallel-connected photodetector arrays, the voltage scales as 1/N, where N is the number of photodetectors connected in parallel. For the series-connected photodetector arrays, the loss in current may not be a significant concern, particularly for applications where detection is based on voltage amplitude.

For series-connected photodetector arrays, the voltage amplitude is relatively independent of the number of photodetectors connected in series. However, as N scales to very large numbers and the series-connected photodetector array fall time approaches the rise time, the signal amplitude is reduced since the signal starts decaying before it can reach the maximum amplitude. For the case where the signal rise time and fall time are equivalent, the voltage amplitude of the array is reduced by about a factor of 2× (6 dB) compared to the voltage amplitude of a single element.

Table 2 summarizes estimated properties of various photodetector configurations.

TABLE 2

| | Capacitance per readout circuit | Voltage Amplitude | Electrical timing jitter $\sigma_t$(electrical noise) |
|---|---|---|---|
| Individual SiPM | $C_{SiPM}$ | 1 | 1 |
| Parallel connection N × N SiPMs (1 readout circuit) | $N^2 \times C_{SiPM}$ | $1/N^2$ | $N^2$ |
| Series connection N × N SiPMs (1 readout circuit) | $C_{SiPM}/N^2$ | 1 | 1 |
| N × N array SiPMs in parallel using resistive Anger Logic readout (4 readout circuits) | $N^2 \times C_{SiPM}/4$ | $4/N^2$ | $4/N^2$ |
| N × N array of SiPMs, checkerboard configuration using resistive Anger Logic combination at edges (4 readout circuits) | $C_{SiPM}$ | 1 | 1 |
| N × N array of SiPMs, checkerboard configuration, using hybrid Anger Logic readout with pole zero compensation | $\sim C_{SiPM}/N$ | 1 | 1 |

Figure 13:
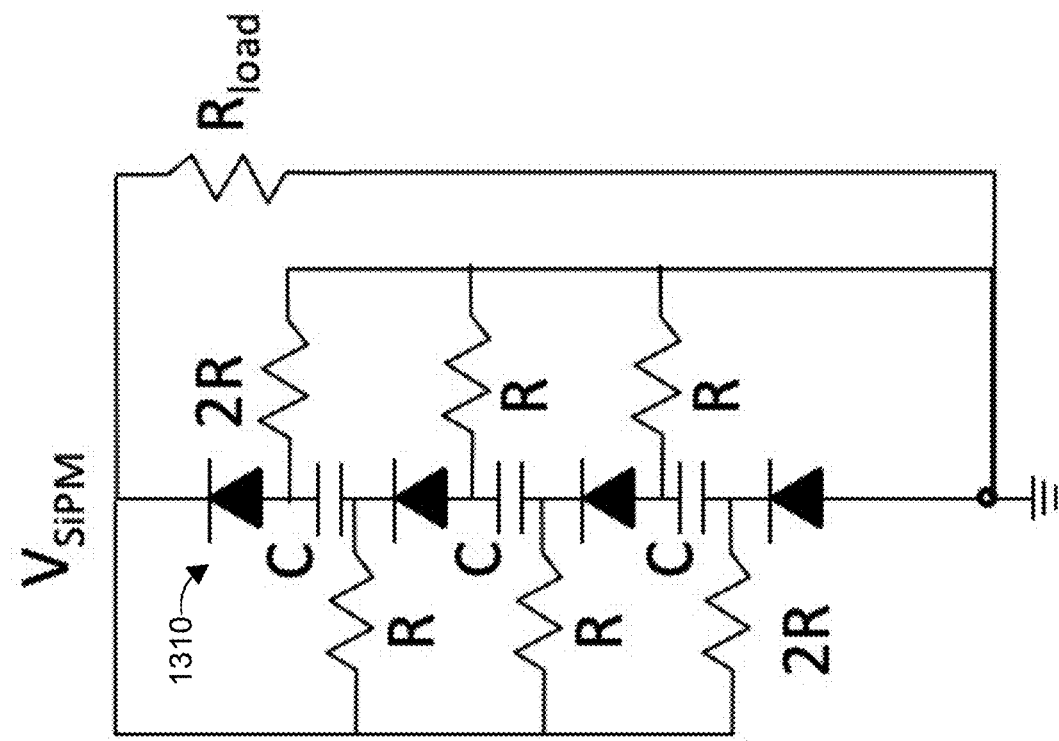
FIG. 13 is a schematic electrical diagram of a representative photodetector array according to an alternative embodiment.

FIG. 13 is a schematic electrical diagram of a representative photodetector array 1300 according to an alternative embodiment. The photodetector array 1300 can be the same as vertical array 830 and/or horizontal array 840. The photodetector array 1300 includes a plurality of photodetectors 1310 that are electrically coupled in series with each other. The bias voltage $V_{SIPM}$ is electrically coupled in parallel to each photodetector 1310, which allows a lower bias voltage ($V_{SIPM}$) to be used in photodetector array 1300 than in photodetector array 1000, which requires $N \times V_{SIPM}$ due to the series connection of the bias voltage to each photodetector 1010. In some embodiments, this configuration may relax the accuracy tolerance on the resistors R, provided the voltage drop across each R is relatively small. For example, 10% accuracy resistors R can be used provided the shunt resistance of the photodetectors Rs is larger than about $$100 \times R\left(R < \frac{R_s}{100}\right).$$

In photodetector array 1300, the series resistance between $V_{SIPM}$ and ground for each photodetector 1310 is 2R. A typical resistance R is 100 kOhm and a typical capacitance C is 10 nF is some embodiments.

Figure 14:
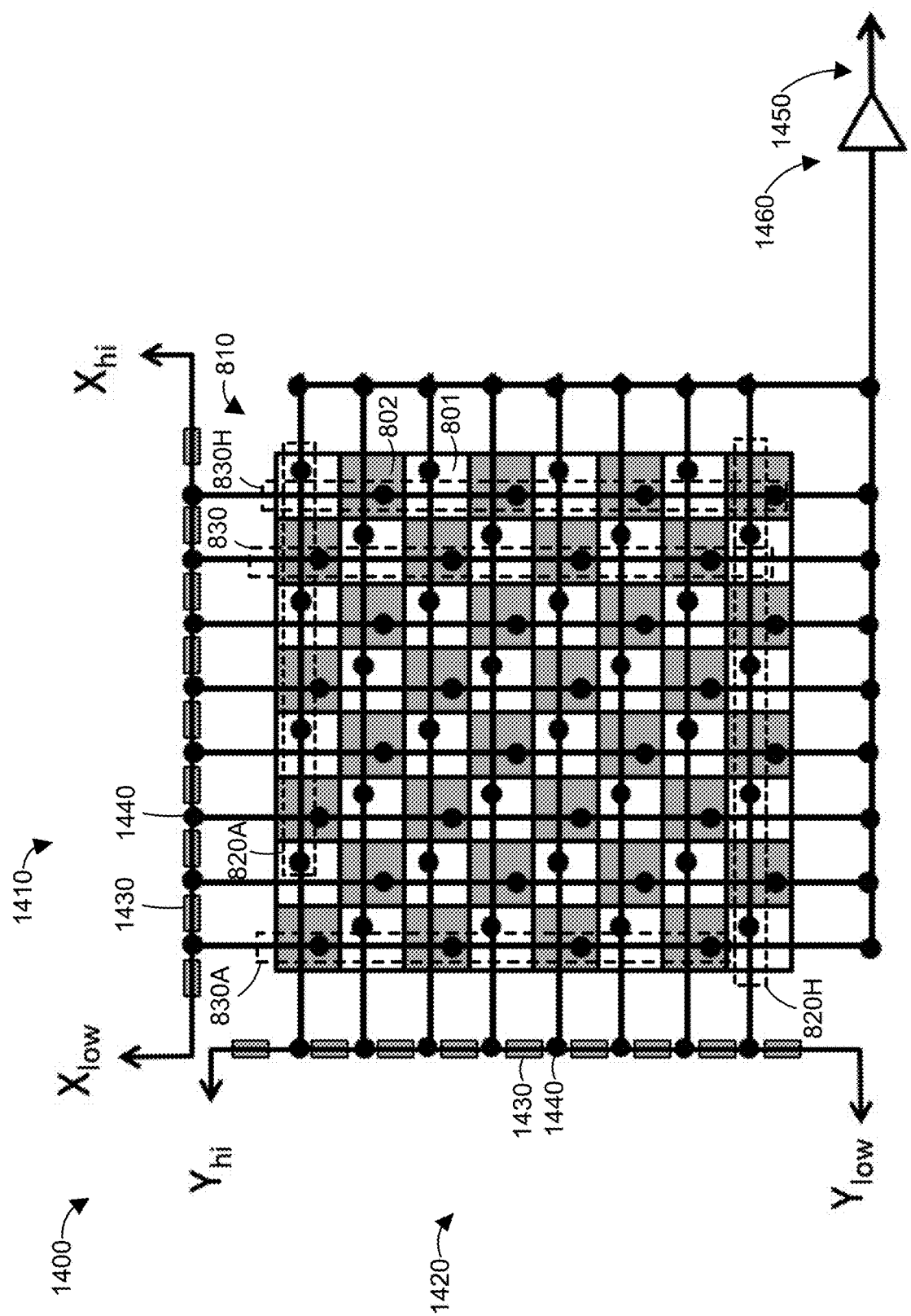
FIG. 14 is a schematic diagram of a position-sensitive device according to one or more embodiments.

To determine the two-dimensional position of the photodetectors that detect photons, VA and HA readouts lines 1410, 1420 (e.g., horizontal and vertical readout lines, respectively) can be used in photodetector grid 810 of device 1400, as illustrated in FIG. 14. The VA readout line 1410 is electrically coupled to each vertical array 830 and the HA readout line 1420 is electrically coupled to each horizontal array 820. On the HA readout line 1410, a passive circuit element 1430 is electrically coupled between terminations 1440 of adjacent vertical arrays 830, between the termination 1440 of the first vertical array 830A and the $X_{low}$ output, and between the termination 1440 of the last vertical array 830H and the $X_{hi}$ output. On the HA readout line 1420, a passive circuit element 1430 is electrically coupled between terminations 1440 of adjacent horizontal arrays 820, between the termination 1440 of the first horizontal array 820A and the $Y_{hi}$ output, and between the termination 1440 of the last horizontal array 820H and the $Y_{low}$ output. An RF amplifier can be electrically coupled between the outermost or last passive circuit element 1430 and each output ($Y_{hi}$, $Y_{low}$, $X_{hi}$, $X_{low}$). For example, an RF amplifier can be electrically coupled between (a) the passive circuit element 1430 that is electrically coupled between the termination 1440 of the last horizontal array 820H and the $Y_{low}$ output and (b) the $Y_{low}$ output.

In addition, a passive circuit element 830 is electrically coupled between terminations 1440 of adjacent horizontal arrays 820, between the termination 1440 of the first horizontal array 820A and the $Y_{low}$ output, and between the termination 1440 of the last horizontal array 820H and the $Y_{hi}$ output. The passive circuit elements 1430 can be or comprise a resistor, a capacitor, and/or an inductor. Common approaches use either (a) a resistor or (b) a resistor and capacitor that are electrically coupled in parallel to each other. The passive circuit elements 1430 cause the current flowing out of the horizontal arrays 820 (or vertical arrays 830) to the readout outputs $Y_{low}$ and $Y_{hi}$ (or $X_{low}$ and $X_{hi}$) to split in proportion to the effective impedance to the readout outputs. The splitting ratio varies based on the location of the detecting photodetector array 820, 830 with respect to the corresponding readout line 1410, 1420. For example, current flowing out of the first horizontal array 820A passes through 1 passive circuit element 1430 to reach the $Y_{hi}$ output but it flows through 8 passive circuit elements 1430 to reach the $Y_{low}$ output. As such, the relative current flowing out of outputs $Y_{low}$ and $Y_{hi}$ can be used to determine the vertical ("y") position of the horizontal array 820 that detected the photon(s) and that generated the photocurrent. Likewise, the relative current flowing out of outputs $X_{low}$ and $X_{hi}$ can be used to determine the horizontal ("x") position of the vertical array 830 that detected the photon(s) and that generated the photocurrent. The x and y positions can be determined as:

$$X_{position} = \frac{I(X_{hi}) - I(X_{low})}{I(X_{hi}) + I(X_{low})} \quad (4)$$

$$Y_{position} = \frac{I(Y_{hi}) - I(Y_{low})}{I(X_{hi}) + I(X_{low})} \quad (5)$$

where $I(X_{hi})$ and $I(X_{low})$ are the current flowing through the $X_{hi}$ and $X_{low}$ outputs, respectively, and $I(Y_{hi})$ and $I(Y_{low})$ are the current flowing through the $Y_{hi}$ and $Y_{low}$ outputs, respectively.

The total current (or charge) collected by the photodetector grid 810 can be collected at common output 1450 which includes an optional amplifier 1460 (e.g., an RF amplifier).

In an alternative embodiment, the passive circuit elements 1430 can include or can be an inductor. In this embodiment, the inductor along with the series-connected photodetector array form a lumped-element transmission line with an effective impedance $$Z_o = \sqrt{\frac{L}{C}}$$

and an effective delay of $\sqrt{LC}$ per element. In this embodiment, the effective impedance to $Y_{hi}$ and $Y_{low}$ is equal, so the current splits evenly upwards and downwards. The position sensitivity is encoded in the relative arrival times of the signals at $Y_{hi}$ and $Y_{low}$. If both signals arrive at the same time, then the signal is in the center of the array, and if the signal arrives at $Y_{hi}$ before $Y_{low}$, the signal is closer to $Y_{hi}$ (or vice versa). The amount of delay between $Y_{hi}$ and $Y_{low}$ can be used to refine the position estimation.

Figure 15:
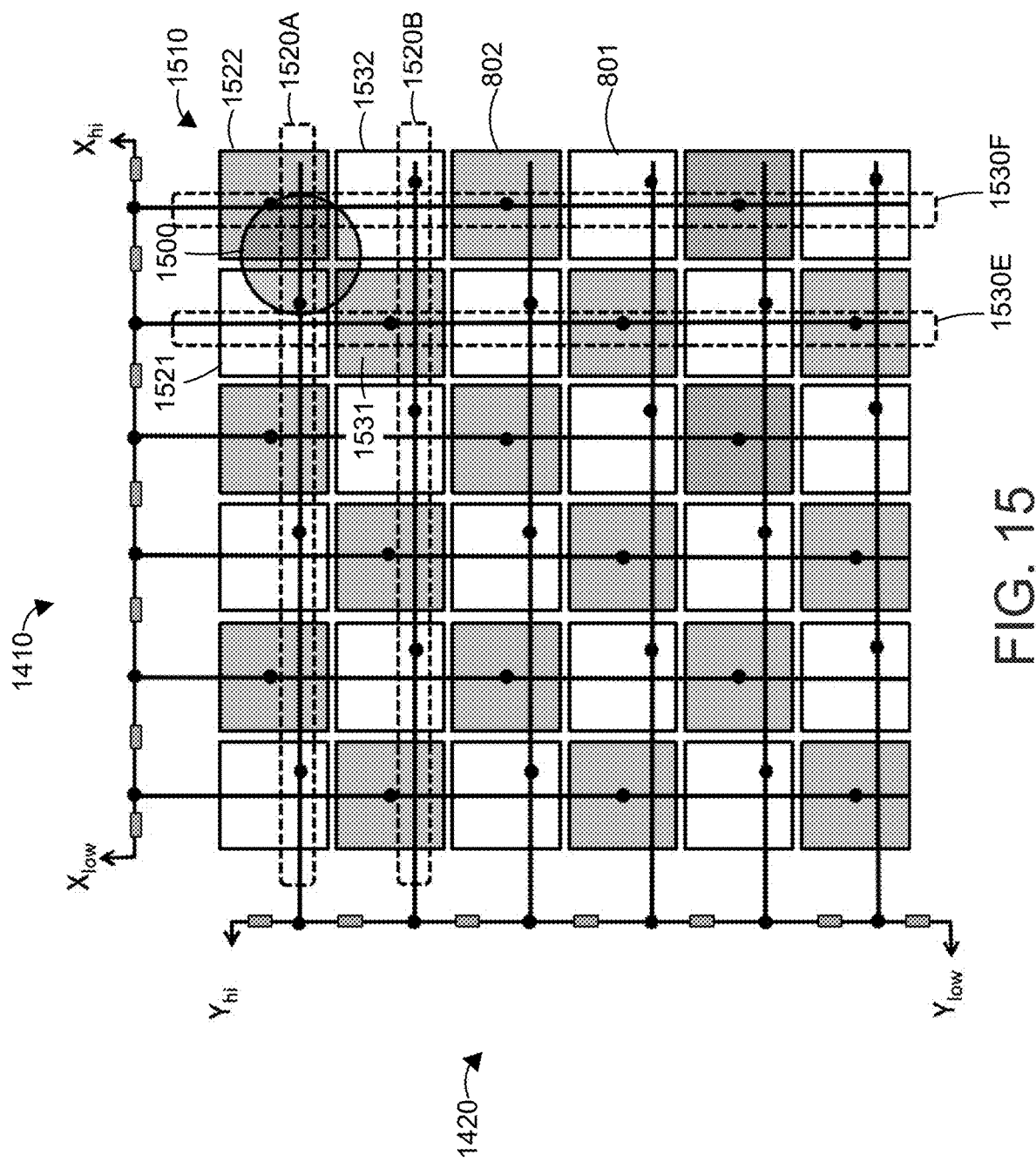
FIG. 15 is a simplified schematic diagram of a photodetector grid to illustrate the detection of a photon beam.

FIG. 15 is a simplified schematic diagram of a photodetector grid 1510 to illustrate the detection of a photon beam 1500. Photodetector grid 1510 is a simplified version of photodetector grid 810 of FIG. 14 and does not include the common output 1450 for clarity purposes only. In addition, photodetector grid 1510 is a 6×6 photodetector array photodetectors while photodetector grid 810 of FIG. 14 is an 8×8 photodetector array, but this difference is solely to simplify the illustrations.

The photon beam 1500 is emitted onto photodetectors 1521, 1522, 1531, and 1532 of photodetector array 1510. Photodetectors 1521, 1532 are HA photodetectors 801, and photodetectors 1522, 1531 are VA photodetectors 802. Photodetector 1521 is located in horizontal array 1520A, photodetector 1522 is located in vertical array 1530F, photodetector 1531 is located in vertical array 1530E, and photodetector 1532 is located in horizontal array 1520B. Since the HA photodetectors 801 are electrically coupled in series to each other in each horizontal array 1520, the output of the HA readout line 1420 indicates (e.g., according to equation (2)) that the "y" position of the centroid of the photon beam 1500 is located between horizontal arrays 1520A and 1520B. As a specific example, the signal (photocurrent) from horizontal array 1520A is much greater than the signal (photocurrent) from horizontal array 1520B because the photon beam 1500 is located more on photodetector 1521 than on photodetector 1532. At the HA readout line 1420, the signal from horizontal array 1520A splits with about ⅚ going to $Y_{hi}$ and ⅙ going to $Y_{low}$. This would indicate the Y position corresponds to horizontal array 1520A. The signal (photocurrent) from horizontal array 1520B splits with about ⅔ going to $Y_{hi}$ and ⅔ going to $Y_{low}$, indicating a fraction of the signal is also intersecting row 1520B. If we assume 75% of the signal is emitted from horizontal array 1520A and 25% of the signal is emitted from horizontal array 1520B, then we have:

$Y_{hi}$=75%×⅚+25%×⅙=0.79 (about ⁸⁄₁₀)

$Y_{low}$=75%×⅙+25%×⅔=0.21 (about ²⁄₁₀)

This means that the signal is about 4% lower than centered in row 1520A.

Similarly, since the VA photodetectors 802 are electrically coupled in series to each other in each vertical array 1530, the output of the VA readout line 1410 indicates (e.g., according to equation (1)) that the "x" position of the photon beam 1500 is located at vertical arrays 1530E and 1530F. The actual position of the photon beam 1500 can then be determined based on which horizontal and vertical arrays 1520, 1530 output current. In this example, horizontal arrays 1520A and 1520B output current, and vertical arrays 1530E and 1530F output current. These horizontal and vertical arrays intersect at photodetectors 1521, 1522, 1531, and 1532, which correspond to the detected position of the photon beam 1500. The ratio of photocurrent detected at $X_{hi}$ and $X_{low}$ corresponds to the position of the photon beam 1500 with respect to vertical arrays 1530E and 1530F.

The dimensions of the HA and VA photodetectors 801, 802 can be selected so that at least a portion of the photon beam 1500 is directed to at least 4 photodetectors (e.g., 2 HA photodetectors 801 and 2 VA photodetectors 802) based on the dimensions (or expected dimensions) of the photon beam 1500. For example, the HA and VA photodetectors 801, 802 can have a width and a length of about 3 mm when the photon beam 1500 has a diameter of at least about 3.1 mm.

Figure 16:
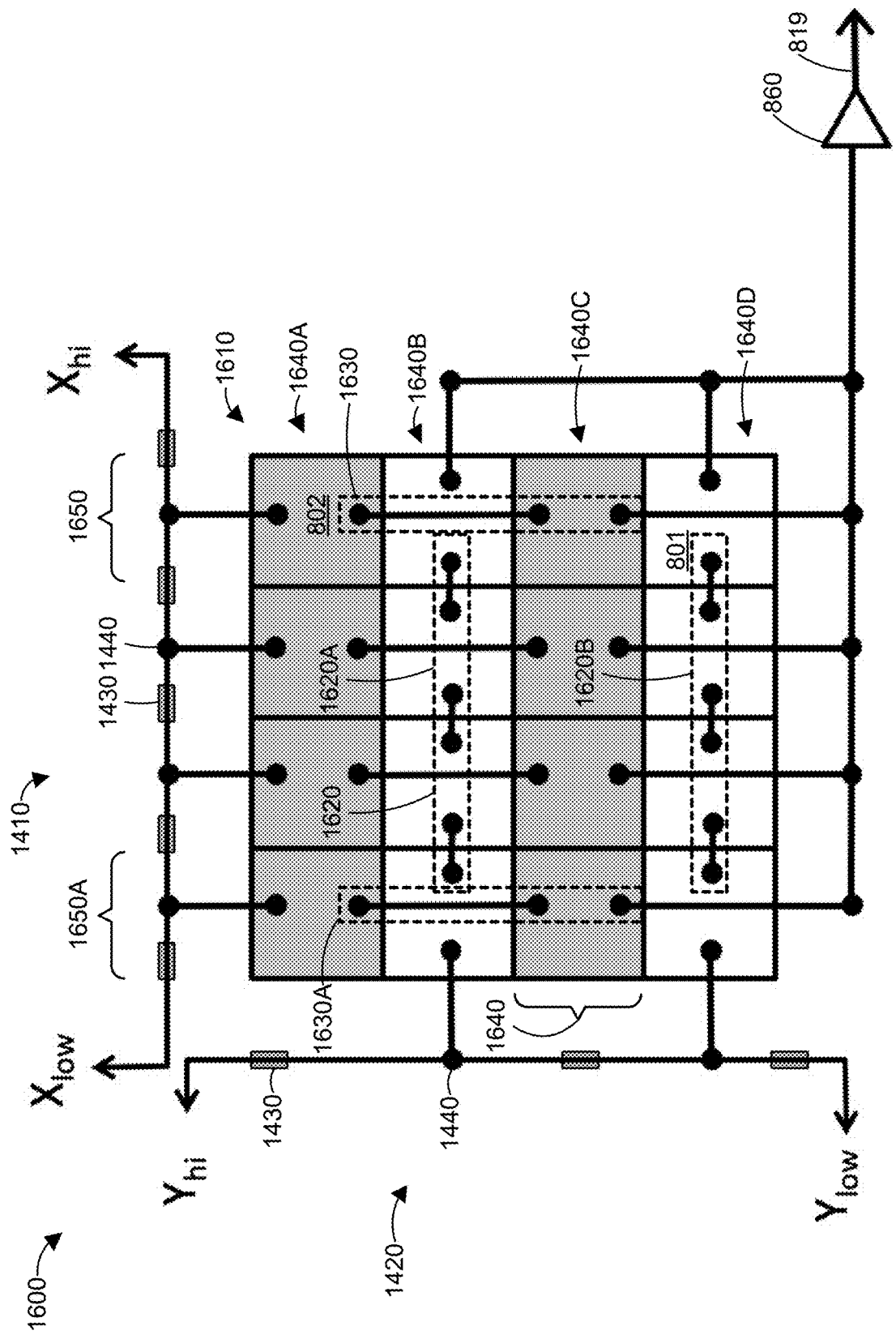
FIG. 16 is a schematic diagram of a position-sensitive photodetector device according to an alternative embodiment.

FIG. 16 is a schematic diagram of a position-sensitive photodetector device 1600 according to an alternative embodiment. The device 1600 includes a plurality of photodetectors arranged as a photodetector grid 1610. The photodetector grid 1610 includes horizontal arrays 1620 of HA photodetectors 801 and vertical arrays 1630 of VA photodetectors 802. In each horizontal array 1620, the HA photodetectors 801 are electrically coupled in series in the same manner as they are in each horizontal array 820. Likewise, in each vertical array 1630, the VA photodetectors 802 are electrically coupled in series in the same manner as they are in each vertical array 830.

The HA and VA photodetectors 801, 802 are arranged in rows 1640 and columns 1650 to form the photodetector grid 1610. Rows 1640B, 1640D (e.g., a first group of rows) include all of the HA photodetectors 801 in a corresponding horizontal array 1620. Rows 1640B, 1640D do not include any VA photodetectors 802. Rows 1640A, 1640C (e.g., a second group of rows) include VA photodetector 802 from different vertical arrays 1630, respectively. For example, row 1640A includes one VA photodetector 802 from each of four different vertical arrays 1630. Each column 1650 includes the VA photodetectors 802 from a corresponding vertical array 1630 and HA photodetectors 801 from different horizontal arrays 1620. For example, column 1650A includes the VA photodetectors 802 from vertical array 1630A and one HA photodetector 801 from each of horizontal arrays 1620A, 1620B.

As can be seen, the photodetector grid 1610 has a "horizontally-striped" configuration. The photodetector grid 1610 has an alternating sequence of HA and VA photodetectors 801, 802 in each column 1650 while each row 1640 has the same type of photodetector. For example, row 1640A only includes VA photodetectors 801, and row 1640B only includes HA photodetectors 802. In other embodiments, the photodetector grid 1610 can have a "vertically-striped" configuration where each column 1650 has the same type of photodetector and each row 1640 has an alternating sequence of HA and VA photodetectors 801, 802.

In the horizontally-striped configuration, for an N×N grid (with N=an even integer) the photodetector grid 1610 includes N/2 rows of HA photodetectors 801, N/2 rows of VA photodetectors 802, and N columns, each column having N/2 HA photodetectors 801 and N/2 VA photodetectors. Since horizontal position is determined using the HA photodetectors 801 and vertical position is determined using the VA photodetectors 802, good position resolution requires that the beam spot size include at least two different HA rows. This is readily achieved by spreading out the beam using optics. The minimum spot size is larger in the horizontally-striped configuration than that for the checkerboard configuration, and generally the spot size should be larger than the area of 9 photodetector elements. For example, the HA and VA photodetectors 801, 802 can have a width and a length of about 3 mm when the photon beam (e.g., photon beam 1500) has a diameter of at least about 6.1 mm.

The position-sensitive photodetector device 1600 includes VA readout line 1410 (e.g., with $X_{hi}$ and $X_{low}$ outputs) and an HA readout line 1420 (e.g., with $Y_{hi}$ and $Y_{low}$ readouts) with passive circuit elements 1430 electrically coupled between each termination 1440 of adjacent horizontal arrays 1620 or vertical arrays 1630, and between the outermost horizontal or vertical array 1620, 1630 and the corresponding output ($Y_{hi}$, $Y_{low}$, $X_{hi}$, $X_{low}$), similar to the configuration of position-sensitive photodetector device 1400. The position of the photon beam can be determined using the position-sensitive photodetector device 1600 (horizontally-striped configuration) in the same manner as using photodetector grid 1510 (checkerboard configuration).

Figure 17:
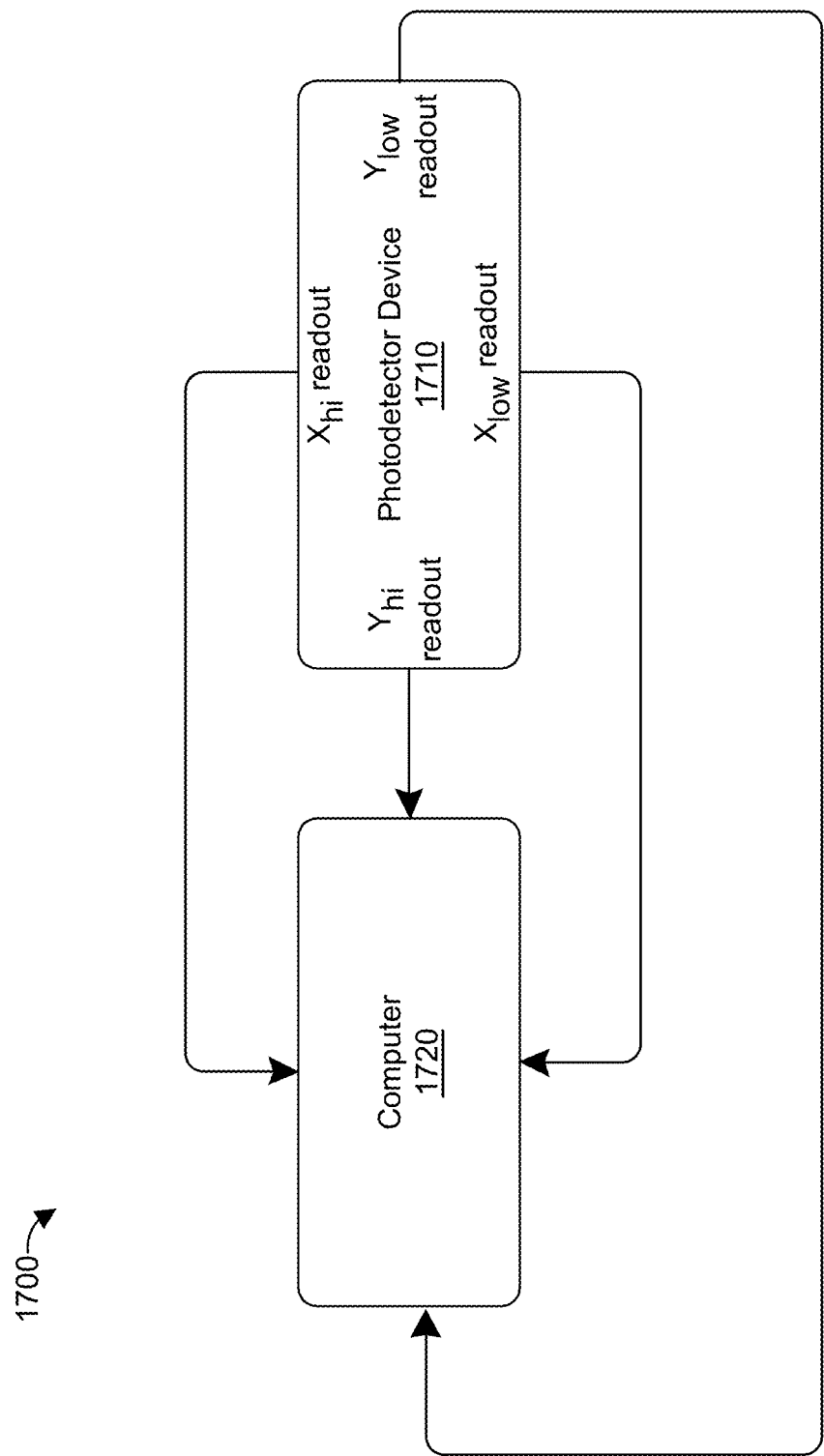
FIG. 17 is a block diagram of a position-sensitive photodetection system according to one or more embodiments.

FIG. 17 is a block diagram of a position-sensitive photodetection system 1700 according to one or more embodiments. The system 1700 includes a photodetector apparatus 1710 that is electrically coupled to a computer 1720. The photodetector apparatus 1710 can be the same as device 80, 1400, or 1600 and can comprise any of the photodetector grids described herein (e.g., 810, 1510, 1610). The photodetector apparatus 1710 includes at least 4 outputs, which correspond to the $X_{hi}$, $X_{low}$, $Y_{hi}$, and $Y_{low}$ readouts (e.g., in VA and HA readout lines 1410, 1420). The total signal (e.g., common output 1450) can be detected using a summing terminal 1450 or by adding the $X_{hi}$, $X_{low}$, $Y_{hi}$, and $Y_{low}$ readouts. In some embodiments it is useful to use the common output to determine the arrival time of a pulsed photon beam, since the common output will have the largest signal amplitude and therefore the lowest timing jitter according to Equation 3. In some embodiments, the photodetector apparatus 1710 can include a separate output for the common output. In some embodiments it is useful to use the common output to determine the arrival time of a pulsed photon beam, since the common output will have the largest signal amplitude and therefore the lowest timing jitter according to Equation 3. The computer 1710 receives data signals (e.g., analog or digital signals) that correspond to the electrical properties (e.g., current and voltage as a function of time) of the "x" and "y" readouts and, optionally, of the common output. Using the data signals, the computer can calculate the position of incoming photons using equations (4) and (5) and the number of photons detected based on the common output signal. The computer 1720 can use lookup tables to more precisely locate the x- and y-position of incoming photons based on a previous calibration or calculation using the equivalent circuit models.

Though the photodetector grids in the figures are illustrated as square arrays of photodetectors, other photodetector grid array shapes are possible. For example, the photodetector grids can be configured as rectangular arrays, circular array, oval arrays, triangular arrays, hexagonal arrays, or other shape arrays. In addition, though the photodetectors are illustrated as square, other photodetector shapes are possible. For example, the photodetectors can be rectangular, triangular, hexagonal, round, or other shapes.

In addition, the photodetector grids and corresponding apparatus have been described in terms of columns and rows which generally lay in a plane defined by the Cartesian coordinate system. However, different photodetector arrangements can be used for other coordinate systems. For example, the plane in which the photodetectors are arranged can be defined by the polar coordinate system and the photodetectors can be arranged at different radii and angles with respect to a reference location.

The invention should not be considered limited to the particular embodiments described above, but rather should be understood to cover all aspects of the invention as fairly set out in the attached claims. Various modifications, equivalent processes, as well as numerous structures to which the invention may be applicable, will be apparent to those skilled in the art to which the invention is directed upon review of this disclosure. The claims are intended to cover such modifications and equivalents.

What is claimed is:

1. A position-sensitive device comprising:
   a photodetector grid having rows and columns and comprising:
      horizontal arrays of HA photodetectors, the HA photodetectors in each horizontal array electrically coupled in series to each other; and
      vertical arrays of VA photodetectors, the VA photodetectors in each vertical array electrically coupled in series to each other;
   an HA output line electrically coupled to each horizontal array of HA photodetectors;
   a VA output line electrically coupled to each vertical array of VA photodetectors,
   wherein:
      the HA and VA photodetectors are arranged in an alternating sequence to form the photodetector grid,
      each row includes all of the HA photodetectors from only one of the horizontal arrays and only one VA photodetector from each of a plurality of different vertical arrays,
      each column includes all of the VA photodetectors from only one of the vertical arrays and only one HA photodetector from each of a plurality of different horizontal arrays, and
      a respective shunt resistor is electrically coupled in parallel with each HA photodetector and in parallel with each VA photodetector.

2. The device of claim 1, wherein:
   the HA photodetectors in adjacent horizontal arrays are positionally-offset along a horizontal axis, and
   the VA photodetectors in adjacent vertical arrays are positionally-offset along a vertical axis.

3. The device of claim 2, wherein the HA and VA photodetectors are arranged in a checkerboard configuration.

4. The device of claim 1, further comprising passive circuit elements electrically coupled to the HA output line, wherein each horizontal array has a horizontal array termination that is electrically coupled to the HA output line, the passive circuit elements and the horizontal array terminations in an alternating arrangement along the HA output line.

5. The device of claim 4, further comprising first and second outputs at opposing ends of the HA output line and one of the passive circuit elements is electrically coupled to the HA output line between the first output and a first outermost horizontal array termination and another of the passive circuit elements is electrically coupled to the HA output line between the second output and a last outermost horizontal array termination.

6. The device of claim 4 wherein each passive circuit element comprises a resistor, a capacitor, and/or an inductor.

7. The device of claim 4 wherein each passive circuit element comprises a resistor electrically disposed in parallel with a capacitor.

8. The device of claim 1, further comprising passive circuit elements electrically coupled to the VA output line, wherein each vertical array has a vertical array termination that is electrically coupled to the VA output line, the passive circuit elements and the vertical array terminations in an alternating arrangement along the VA output line.

9. The device of claim 8, further comprising first and second outputs at opposing ends of the VA output line and one of the passive circuit elements is electrically coupled to the VA output line between the first output and a first outermost vertical array termination and another of the passive circuit elements is electrically coupled to the VA output line between the second output and a last outermost vertical array termination.

10. The device of claim 9, wherein a vertical position of a light incident on the device is determined according to a ratio of photocurrent detected at the first and second outputs of the VA output line.

11. The device of claim 1, wherein terminations of the vertical and horizontal arrays are electrically coupled to a common output.

12. The device of claim 11, further comprising an RF amplifier that is electrically coupled between the terminations and the common output.

13. The device of claim 1, wherein the HA photodetectors and the VA photodetectors are the same type of photodetector.

14. The device of claim 1, wherein the HA photodetectors and the VA detectors comprise silicon photomultipliers, PIN photodiodes, PN diodes, photoconductors, and/or avalanche photodiodes.

15. The device of claim 5, wherein a horizontal position of a light incident on the device is determined according to a ratio of photocurrent detected at the first and second outputs of the HA output line.

16. The device of claim 1, wherein the HA photodetectors and VA photodetectors are configured to have a size relative to expected dimensions of a light incident on the device such that at least a portion of the light is directed simultaneously to at least 2 HA photodetectors and at least 2 VA photodetectors.

17. A position-sensitive device comprising:
   a photodetector grid having rows and columns and comprising:
      horizontal arrays of HA photodetectors, the HA photodetectors in each horizontal array electrically coupled in series to each other; and
      vertical arrays of VA photodetectors, the VA photodetectors in each vertical array electrically coupled in series to each other;
   an HA output line electrically coupled to each horizontal array of HA photodetectors;
   a VA output line electrically coupled to each vertical array of VA photodetectors,
   wherein:
      a first group of rows consists of the HA photodetectors from a corresponding horizontal array,
      a second group of rows consists of only one VA photodetector from each of a plurality of different vertical arrays, and
      each column includes all of the VA photodetectors from only one of the vertical arrays and only one HA photodetector from each of a plurality of different horizontal arrays.

18. The device of claim 17, wherein:
   the photodetector grid has an alternating arrangement, along a vertical axis, of (a) a first group row and (b) a second group row,
   the first group row is one of the rows in the first group of rows, and
   the second group row is one of the rows in the second group of rows.

19. The device of claim 18, wherein the device is configured to detect an incident position of a light and the device includes an optical system configured to spread out the light such that the light is incident on at least two different rows from the first group of rows.

* * * * *